US008697582B2

(12) United States Patent
 Okazaki et al.

(10) Patent No.: US 8,697,582 B2
(45) Date of Patent: Apr. 15, 2014

(54) SUBSTRATE CONVEYING ROLLER, THIN FILM MANUFACTURING DEVICE, AND THIN FILM MANUFACTURING METHOD

(71) Applicant: Panasonic Corporation, Osaka (JP)

(72) Inventors: Sadayuki Okazaki, Osaka (JP); Kazuyoshi Honda, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/985,798

(22) PCT Filed: Oct. 30, 2012

(86) PCT No.: PCT/JP2012/006963
§ 371 (c)(1),
(2), (4) Date: Aug. 15, 2013

(87) PCT Pub. No.: WO2013/076922
PCT Pub. Date: May 30, 2013

(65) Prior Publication Data
US 2014/0057448 A1    Feb. 27, 2014

(30) Foreign Application Priority Data

Nov. 22, 2011  (JP) .................. 2011-255553

(51) Int. Cl.
*H01L 21/31* (2006.01)
*C23C 16/00* (2006.01)
(52) U.S. Cl.
USPC ............ 438/758; 438/795; 118/724; 118/725

(58) Field of Classification Search
USPC .......... 438/758, 765, 781, 795, 799; 118/724, 118/725
See application file for complete search history.

(56) References Cited

U.S. PATENT DOCUMENTS 5,076,203 A    12/1991  Vaidya et al.
5,177,878 A *  1/1993   Visser .............................. 34/92
(Continued)

FOREIGN PATENT DOCUMENTS

JP    60-184424 U    12/1985
JP    1-152262 A     6/1989
(Continued)

OTHER PUBLICATIONS

International Search Report issued in PCT/JP2012/006963, dated Feb. 5, 2013.

*Primary Examiner* — Kevin M Picardat
(74) *Attorney, Agent, or Firm* — McDermott Will & Emery LLP

(57) ABSTRACT

A substrate-conveying roller includes a first shell, a second shell, an internal block, a manifold, and a clearance. The first shell has a plurality of first through holes serving as supply paths for a gas. The internal block is disposed inside the first shell. The manifold is formed in the internal block so as to guide the gas to the first through holes within the region of a specific angle. The clearance is formed so as to guide the gas to the first through holes outside the region of the specific angle. The second shell has second through holes for guiding the gas from the manifold to the first through holes, and is disposed between the first shell and the internal block. The central axes of the first through hole are offset from the central axes of the second through holes.

15 Claims, 19 Drawing Sheets

(56) References Cited

U.S. PATENT DOCUMENTS

| | | | |
|---|---|---|---|
| 6,887,803 B2 * | 5/2005 | Yoo | 438/795 |
| 7,226,488 B2 * | 6/2007 | Gat | 29/25.01 |
| 7,358,200 B2 * | 4/2008 | Yoo | 438/795 |
| 2010/0272901 A1 * | 10/2010 | Shinokawa et al. | 427/294 |
| 2011/0117279 A1 * | 5/2011 | Shinokawa et al. | 427/295 |
| 2012/0009349 A1 | 1/2012 | Shinokawa et al. | |
| 2012/0301615 A1 | 11/2012 | Honda et al. | |

FOREIGN PATENT DOCUMENTS

| | | |
|---|---|---|
| JP | 06-145982 A | 5/1994 |
| JP | 2010-242200 A | 10/2010 |
| JP | 2011-058079 A | 3/2011 |
| JP | 2011-214018 A | 10/2011 |
| JP | 4786772 B2 | 10/2011 |
| WO | 02/070778 A1 | 9/2002 |
| WO | 2010-122742 A1 | 10/2010 |
| WO | 2011-093073 A1 | 8/2011 |

* cited by examiner

SUBSTRATE CONVEYING ROLLER, THIN FILM MANUFACTURING DEVICE, AND THIN FILM MANUFACTURING METHOD

RELATED APPLICATIONS

This application is the U.S. National Phase under 35 U.S.C. §371 of International Application No. PCT/JP2012/006963, filed on Oct. 30, 2012, which in turn claims the benefit of Japanese Application No. 2011-255553, filed on Nov. 22, 2011, the disclosures of which Applications are incorporated by reference herein.

TECHNICAL FIELD

The present invention relates to substrate-conveying rollers, apparatuses for producing thin films, and methods for producing thin films.

BACKGROUND ART

Thin-film technology is widely used for performance improvement and size reduction of devices. Thin-film devices not only provide direct benefits to users, but also play an important role in environmental aspects, such as in protection of earth resources and in reduction of power consumption.

A film formation technique that allows a high deposition rate is essential in order to increase the productivity of thin films. Increase in deposition rate is being pursued in film formation methods such as vacuum evaporation methods, sputtering methods, ion plating methods, and CVD methods (Chemical Vapor Deposition Methods). A take-up type thin film production method is known as a method for continuously producing thin films in large numbers. In the take-up type thin film production method, an elongated substrate is unwound from an unwinding roll, a thin film is formed on the substrate being conveyed along a conveyance system, and the substrate is then wound on a winding roll. For example, thin films can be formed with good productivity by combining the take-up type thin film production method with a film formation source that allows a high deposition rate, such as a vacuum evaporation source using electron beam.

Factors that determine success and failure of such a continuous take-up type thin film production include thermal load during film formation, and cooling of the substrate. For example, in the case of vacuum evaporation, thermal radiation from an evaporation source and thermal energy of evaporated atoms are applied to a substrate, and the temperature of the substrate is thus increased. Also in other film formation methods, although the heat source is different, thermal load is applied to a substrate during film formation. The substrate is cooled in order to prevent, for example, deformation and meltdown of the substrate from occurring due to such thermal load. The cooling is not necessarily carried out during film formation, and may be carried out in a region of a substrate-conveyance route other than the film formation region.

As means for cooling a slurry or the like with a roller in the atmosphere, Patent Literature 1 discloses a cooling roller including: a cylindrical body whose wall is provided with a plurality of slits or holes; and a partition plate provided in the cylindrical body. The cylindrical body can rotate relative to the partition plate in a sliding manner, and a coolant gas emitting pipe is provided in a space defined by the partition plate. With this cooling roller, a slurry can be sprayed with a large amount of the coolant gas, and thus can be cooled by removing heat directly from the slurry.

However, in a vacuum atmosphere, such a large amount of coolant gas as to allow direct removal of heat cannot be used in view of maintaining the vacuum. As an example of methods for cooling a substrate during film formation, there is a widely-used method in which a film is formed on a substrate extending along a cylindrical can disposed on a conveyance route of a conveyance system. With this method, heat can be released to a cooling can of large heat capacity by ensuring thermal contact between the substrate and the cylindrical can. Thus, increase in the temperature of the substrate can be prevented. In addition, the temperature of the substrate can be maintained at a specific cooling temperature. Cooling of the substrate by a cooling can is effective also in a region of the substrate-conveyance route other than the film formation region.

One of the methods for ensuring thermal contact between a substrate and a cylindrical can is a gas cooling method. Patent Literature 2 teaches that, in an apparatus for forming a thin film on a web serving as a substrate, a gas is introduced into a region between the web and supporting means. With this method, heat conduction between the web and the supporting means can be ensured, and thus increase in the temperature of the web can be suppressed.

In addition, a cooling belt can also be used as means for cooling a substrate, instead of the cylindrical can. When carrying out film formation using obliquely incident components, it is advantageous, in view of material use efficiency, to form a film on a substrate traveling linearly. In that case, the use of a cooling belt as means for cooling the substrate is effective. Patent Literature 3 discloses a method for cooling a belt used for conveyance and cooling of a substrate material. According to the method disclosed in Patent Literature 3, in the case where a cooling belt for improving the efficiency of thin film formation is used in a thin film formation apparatus that causes thermal load, a cooling mechanism using two or more other cooling belts or a liquid medium is provided inside the cooling belt in order to cool the cooling belt itself. This can increase the cooling efficiency, and thus can lead to improvement of the characteristics of a magnetic tape such as electromagnetic conversion characteristics, and also to significant improvement of the productivity.

Patent Literature 4 describes a substrate-conveying roller that causes less damage to a substrate and that allows gas cooling while preventing deterioration in the degree of vacuum.

CITATION LIST

Patent Literature

Patent Literature 1: JP S60 (1985)-184424 U
Patent Literature 2: JP H1 (1989)-152262 A
Patent Literature 3: JP H6 (1994)-145982 A
Patent Literature 4: JP Patent No. 4786772

SUMMARY OF INVENTION

Technical Problem

A substrate-conveying roller (blowing roller) shown in FIG. 14 of Patent Literature 4 includes an internal block, a first shell, and a second shell. A manifold into which a gas is introduced, and a clearance provided outside the region where the manifold extends, are formed between the second shell and the internal block. A gas is supplied from the manifold to the back surface of a substrate through a plurality of first through holes formed in the first shell and a plurality of second through holes formed in the second shell. Such a configuration makes it possible to cool the substrate while preventing deterioration in the degree of vacuum. However, there is a possibility that foreign matters such as dust enter the through holes, and hinder the relative rotation between the internal block and the shells, thereby causing damage to the substrate.

The present invention aims to provide a technique for cooling a substrate under vacuum while preventing damage to the substrate.

Solution to Problem

That is, the present disclosure provides a substrate-conveying roller having a function of conveying a substrate under vacuum, and a function of supplying a gas for cooling the substrate to the substrate under vacuum, the substrate-conveying roller including: a first shell having a cylindrical outer circumferential surface for supporting the substrate, and a plurality of first through holes provided along a circumferential direction of the outer circumferential surface and serving as supply paths for the gas, the first shell being capable of rotating in synchronization with the substrate; an internal block disposed inside the first shell and blocked from rotating in synchronization with the substrate; a manifold that is a space defined by the internal block inside the first shell so as to retain the gas introduced from outside, that is formed so as to guide the gas to the plurality of first through holes within the range of a specific angle whose vertex is on a rotational axis of the first shell, and that has a relatively large size in a radial direction of the first shell; a clearance that is a space formed inside the first shell, that is formed so as to guide the gas to the plurality of first through holes outside the range of the specific angle, and that has a relatively small size in the radial direction; and a second shell disposed between the first shell and the internal block, and having a second through hole for guiding the gas from the manifold to the plurality of first through holes. In the substrate-conveying roller, a central axis of the first through hole is offset from a central axis of the second through hole.

Advantageous Effects of Invention

The above technique can prevent rotational failure of substrate-conveying rollers, and makes it possible to cool a substrate under vacuum while preventing damage to the substrate.

DESCRIPTION OF EMBODIMENTS

Figure 1:
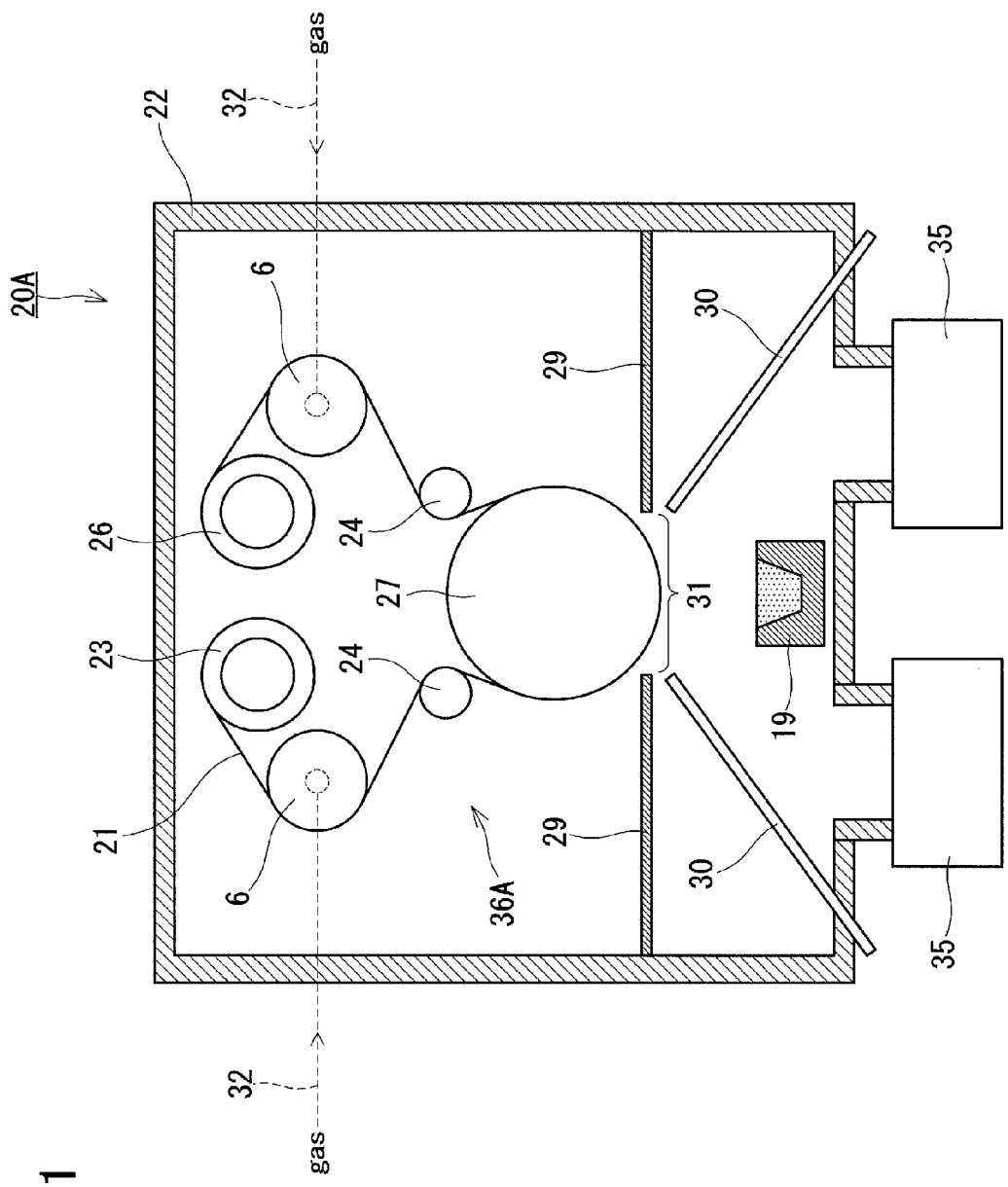
FIG. 1 is a configuration diagram of an apparatus for producing thin films according to an embodiment of the present invention.

A first aspect of the present disclosure provides a substrate-conveying roller having a function of conveying a substrate under vacuum, and a function of supplying a gas for cooling the substrate to the substrate under vacuum, the substrate-conveying roller including: a first shell having a cylindrical outer circumferential surface for supporting the substrate, and a plurality of first through holes provided along a circumferential direction of the outer circumferential surface and serving as supply paths for the gas, the first shell being capable of rotating in synchronization with the substrate; an internal block disposed inside the first shell and blocked from rotating in synchronization with the substrate; a manifold that is a space defined by the internal block inside the first shell so as to retain the gas introduced from outside, that is formed so as to guide the gas to the plurality of first through holes within the range of a specific angle whose vertex is on a rotational axis of the first shell, and that has a relatively large size in a radial direction of the first shell; a clearance that is a space formed inside the first shell, that is formed so as to guide the gas to the plurality of first through holes outside the range of the specific angle, and that has a relatively small size in the radial direction; and a second shell disposed between the first shell and the internal block, and having a second through hole for guiding the gas from the manifold to the plurality of first through holes. In the substrate-conveying roller, a central axis of the first through hole is offset from a central axis of the second through hole.

According to the first aspect, the central axis of the first through hole is offset from the central axis of the second through hole. Therefore, foreign matters are less likely to enter between the internal block and the second shell. This can prevent rotational failure of the substrate-conveying roller, and makes it possible to cool the substrate under vacuum while preventing damage to the substrate.

A second aspect of the present disclosure provides the substrate-conveying roller as set forth in the first aspect, wherein the first shell rotates in synchronization with the second shell. When both of the shells rotate in synchronization, the relative positional relationship between the first through hole and the second through hole is maintained, and therefore, entry of foreign matters into the second through hole can be prevented more effectively.

A third aspect of the present disclosure provides the substrate-conveying roller as set forth in the second aspect, wherein the second shell has an outer circumferential surface that is in close contact with an inner circumferential surface of the first shell, and the clearance is formed between the second shell and the internal block. Such a configuration can prevent foreign matters from entering between the first shell and the second shell. In addition, since heat is transferred well from the first shell to the second shell, the efficiency of cooling the substrate is increased.

A fourth aspect of the present disclosure provides the substrate-conveying roller as set forth in any one of the first to third aspects, wherein an outline of the first through hole is spaced apart from an outline of the second through hole, when viewed in a projection view obtained by developing the first shell and the second shell, and projecting the first shell and the second shell on a plane parallel to a surface of the first shell. Such a configuration further ensures that foreign matters can be prevented from entering between the internal block and the second shell.

A fifth aspect of the present disclosure provides the substrate-conveying roller as set forth in any one of the first to fourth aspects, wherein the second shell further has a recess formed at such a position that the recess faces the first through hole, and the second through hole opens into the recess. With such a configuration, entry of foreign matters into the second through hole can be prevented more effectively.

A sixth aspect of the present disclosure provides the substrate-conveying roller as set forth in the fifth aspect, wherein the plurality of first through holes face the recess. With such a configuration, the process for forming the recess of the second shell by machining can avoid being complicated.

A seventh aspect of the present disclosure provides the substrate-conveying roller as set forth in the fifth or sixth aspect, wherein the second shell has a plurality of the second through holes, and the plurality of second through holes open into the recess. With such a configuration, the process for forming the recess of the second shell by machining can avoid being complicated.

An eighth aspect of the present disclosure provides the substrate-conveying roller as set forth in any one of the first to seventh aspects, the substrate-conveying roller further including a support body supporting the internal block, wherein the support body has a gas flow path for introducing the gas from outside into the manifold. With such a configuration, another member for the gas flow path is not required.

A ninth aspect of the present disclosure provides the substrate-conveying roller as set forth in any one of the first to eighth aspects, wherein the first through hole has a diameter decreasing from an outer circumference side of the first shell toward a center side of the first shell. When the first through hole has such a shape, the effect of preventing entry of foreign matters is enhanced.

A tenth aspect of the present disclosure provides the substrate-conveying roller as set forth in any one of the first to ninth aspects, wherein the second through hole has a diameter decreasing from an outer circumference side of the second shell toward a center side of the second shell. When the second through hole has such a shape, the effect of preventing entry of foreign matters is enhanced.

An eleventh aspect of the present disclosure provides the substrate-conveying roller as set forth in any one of the fifth to seventh aspects, wherein the recess includes a first portion located on an extended line of the central axis of the first through hole and a second portion into which the second through hole opens, and the first portion is deeper than the second portion. With such a configuration, foreign matters are likely to be caught by the first portion. Therefore, even when foreign matters can pass through the first through hole, the foreign matters are less likely to reach the second through hole.

A twelfth aspect of the present disclosure provides the substrate-conveying roller as set forth in any one of the first to eleventh aspects, wherein a portion of the second through hole that is located on an outer circumference side of the second shell has a smaller diameter than a portion of the first through hole that is located on a center side of the first shell. When there is such a relationship, foreign matters smaller than the diameter of the first through hole and larger than the diameter of the second through hole can be prevented from entering the clearance.

A thirteenth aspect of the present disclosure provides the substrate-conveying roller as set forth in any one of the first to twelfth aspects, wherein the plurality of first through holes constitute: (i) a first group provided along the circumferential direction at a predetermined position in a width direction parallel to the rotational axis; and (ii) a second group provided along the circumferential direction at a position adjacent to the predetermined position, and the first through holes belonging to the first group and the first through holes belonging to the second group are arranged in a staggered manner. Such an arrangement of the first through holes allows more uniform cooling.

A fourteenth aspect of the present disclosure provides an apparatus for producing thin films, the apparatus including: a vacuum chamber; a conveyance system having the substrate-conveying roller of any one of the first to thirteenth aspects and disposed in the vacuum chamber so as to convey an elongated substrate from an unwinding position to a winding position; an opening provided in a conveyance route of the conveyance system; and a film formation source for applying a material to the substrate at the opening.

A fifteenth aspect of the present disclosure provides a method for producing thin films, the method including the steps of constructing a conveyance system for an elongated substrate in a vacuum chamber using the substrate-conveying roller of any one of the first to thirteenth aspects; conveying the elongated substrate from an unwinding position to a winding position in the conveyance system; and evaporating a material from a film formation source toward an opening provided in a conveyance route of the conveyance system, so as to apply the material to the substrate.

According to the fourteenth and fifteenth aspects, it is possible to cool the substrate under vacuum while preventing damage to the substrate. Therefore, high-quality thin films can be produced with high productivity.

Hereinafter, embodiments of the present invention will be described with reference to the drawings. It should be noted that the present invention is not limited by the embodiments described below.

As shown in FIG. 1, an apparatus 20A for producing thin films includes a vacuum chamber 22, a conveyance system 36A, a film formation source 19, shield plates 29, raw material gas introduction pipes 30, and evacuation pumps 35. The conveyance system 36A is composed of a spool roller 23, blowing rollers 6, conveying rollers 24, a can 27, and a spool roller 26. The blowing rollers 6 have the function of conveying a substrate 21, and the function of supplying a gas for cooling the substrate 21 to the substrate 21. The blowing rollers 6 also serve as conveying rollers. A gas (coolant gas) is supplied from the outside of the vacuum chamber 22 to the blowing rollers 6 through gas supply pipes 32.

The type of the gas to be introduced into the blowing rollers 6 is not particularly limited. For example, oxygen gas, hydrogen gas, inert gas, or the like, can be used. Inert gas that can be used is nitrogen gas, helium gas, neon gas, argon gas, xenon gas, krypton gas, or the like. In addition, a mixture of a plurality of types of gases may be used.

The vacuum chamber 22 is a pressure-resistant container member having an internal space. The conveyance system 36A, the film formation source 19, and the like, are disposed in the internal space of the vacuum chamber 22. The spool roller 23 is a roller member provided so as to be rotatable around an axial core. The substrate 21 having the shape of an elongated strip is wound around the surface of the spool roller 23. The spool roller 23 feeds the substrate 21 to a conveying roller (the blowing roller 6 in FIG. 1) that is closest to the spool roller 23.

The evacuation pumps 35 are provided outside the vacuum chamber 22, and serve to reduce the pressure inside the vacuum chamber 22 to a level suitable for thin film formation. For example, each evacuation pump 35 is composed of a vacuum evacuation system whose main pump is an oil diffusion pump, a cryopump, a turbo-molecular pump, or the like.

A metal foil, a polymer film, a composite of a polymer film and a metal foil, or the like, can be used as the substrate 21. Examples of the metal foil include aluminum foils, copper foils, nickel foils, titanium foils, and stainless steel foils. Examples of the polymer film include polyethylene terephthalate, polyethylene naphthalate, polyamide, and polyimide. However, the material of the substrate 21 is not particularly limited. An elongated substrate made of a material other than the aforementioned materials can be used as the substrate 21.

The width of the substrate 21 is, for example, 50 to 1000 mm. A desirable thickness of the substrate 21 is, for example, 3 to 150 μm. When the width of the substrate 21 is less than 50 mm, the loss of the gas during gas cooling is large in the width direction of the substrate 21. However, this does not mean that the present invention is inapplicable. When the thickness of the substrate 21 is less than 3 μm, the substrate 21 has an extremely low heat capacity, and is thus prone to thermal deformation. However, neither the extremely low heat capacity nor the proneness to thermal deformation means that the present invention is inapplicable.

Although depending on the type of a thin film to be fabricated and on the conditions for film formation, the conveyance speed of the substrate 21 is, for example, 0.1 to 500 m/minute. The tension applied to the substrate 21 being conveyed is adjusted as appropriate, depending on the material of the substrate 21, the thickness of the substrate 21, and the conditions such as the film formation rate.

The conveying rollers 24 are each a roller member provided so as to be rotatable around an axial core. The conveying rollers 24 guide the substrate 21 fed from the spool roller 23 to a film formation region, and finally to the spool roller 26. When the substrate 21 travels along the can 27 in an opening 31 provided in the film formation region, material particles coming from the film formation source 19 react with a raw material gas introduced from the raw material gas introduction pipes 30 as necessary, and are deposited on the substrate 21. As a result, a thin film is formed on a surface of the substrate 21. The spool roller 26 is a roller member provided so as to be driven to rotate by drive means (e.g., a motor) which is not shown. The substrate 21 on which a thin film has been formed is wound and stored on the spool roller 26.

Various film formation sources can be used as the film formation source 19. Examples of film formation sources that can be used include: evaporation sources using resistance heating, induction heating, or electron beam heating; ion plating sources; sputtering sources; and CVD sources. In addition, an ion source or a plasma source can be used in combination with the film formation source 19. The film formation source 19 is provided vertically below the opening 31. The film formation source 19 is a container member whose upper portion is open. One specific example of the film formation source 19 is an evaporation crucible. A material is placed inside the evaporation crucible. Heating means such as an electron gun is provided in the vicinity of the film formation source 19. The material inside the evaporation crucible is heated and evaporated by an electron beam emitted from the electron gun. The vapor of the material moves vertically upward, and attaches to the surface of the substrate 21 via the opening 31. Thus, a thin film is formed on a surface of the substrate 21.

By the shield plates 29, the region in which material particles coming from the film formation source 19 contact the substrate 21 is limited only to the opening 31.

The film formation apparatus 20A may further include means for introducing a film formation gas for reactive film formation into the vacuum chamber 22. One example of the means for introducing a film formation gas is the raw material gas introduction pipe 30 of FIG. 1. For example, the raw material gas introduction pipe 30 is a tubular member one end of which is disposed vertically above the film formation source 19, and the other end of which is provided outside the vacuum chamber 22. The raw material gas introduction pipe 30 supplies, for example, oxygen or nitrogen to the vapor of the material. Thus, a thin film whose main component (a component the mass content of which is largest) is an oxide, a nitride, or an oxynitride of the material coming from the film formation source 19, is formed on a surface of the substrate 21. The raw material gas introduction pipe 30 is connected to film formation reaction gas supply means which is not shown. Examples of the film formation reaction gas supply means include gas cylinders and gas generators.

The substrate 21 on which a thin film has been formed is conveyed via the other conveying roller 24, and is wound on the spool roller 26.

The blowing rollers 6 are disposed on the substrate conveyance route from the spool roller 23 to the spool roller 26. The substrate 21 is cooled by the blowing rollers 6. Only one blowing roller 6 may be provided in the conveyance system 36A, or a plurality of blowing rollers 6 may be provided in the conveyance system 36A as in the present embodiment. Furthermore, the blowing roller 6 may be provided at such a position that the blowing roller 6 can cool the substrate 21 before film formation, or at such a position that the blowing roller 6 can cool the substrate 21 after film formation.

Figure 2:
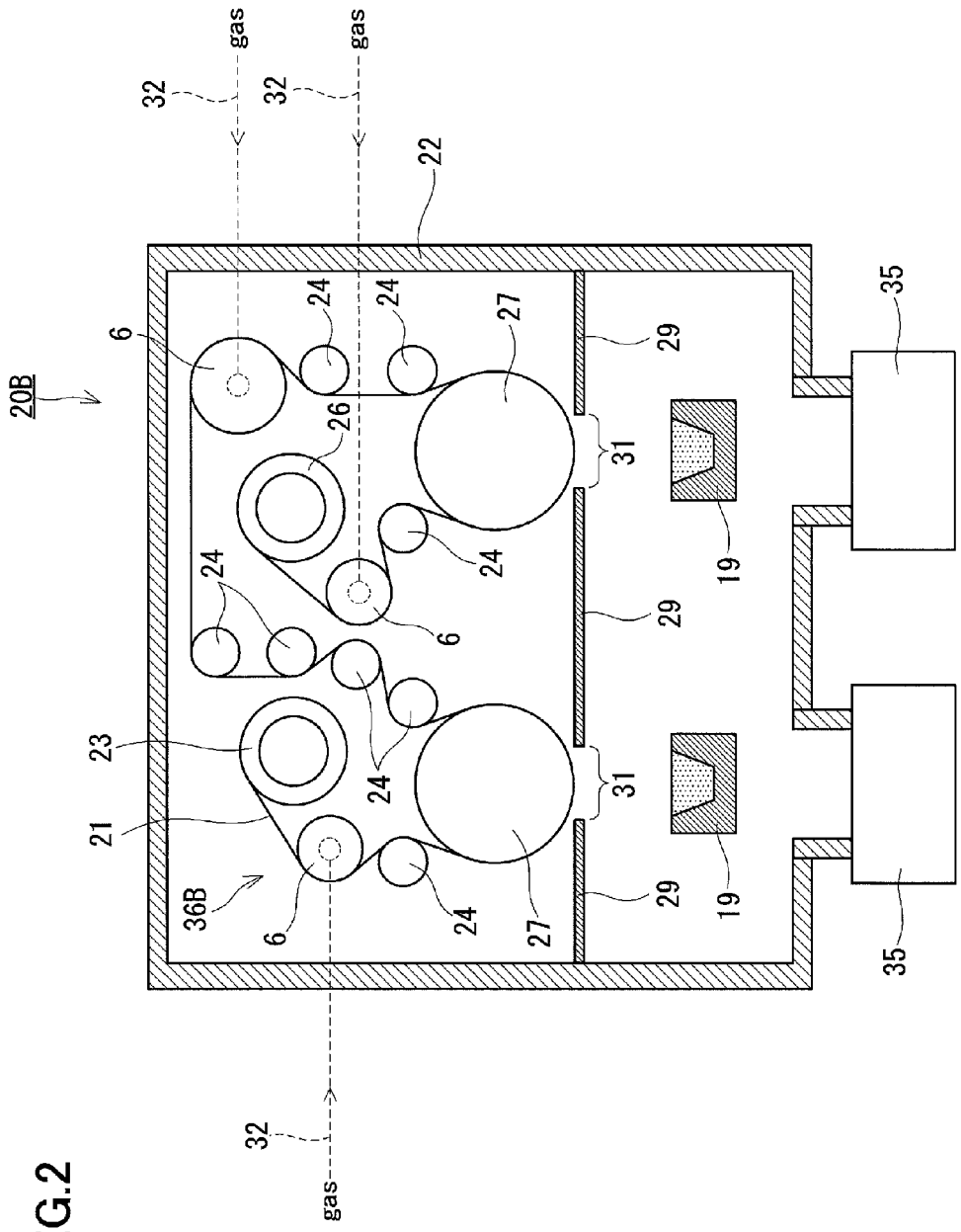
FIG. 2 is a configuration diagram of an apparatus for producing thin films according to another embodiment of the present invention.

As shown in FIG. 2, an apparatus 20B for producing thin films according to another embodiment includes a conveyance system 36B. A plurality of film formation sources 19 and a plurality of openings 31 are provided inside the vacuum chamber 22. The conveyance system 36B has a plurality of cans 27, and is configured to form thin films on both surfaces of the substrate 21. The conveyance system 36B is provided with a plurality of blowing rollers 6.

Next, the detailed structure of the blowing roller 6 will be described together with some modifications.

Figure 3A:
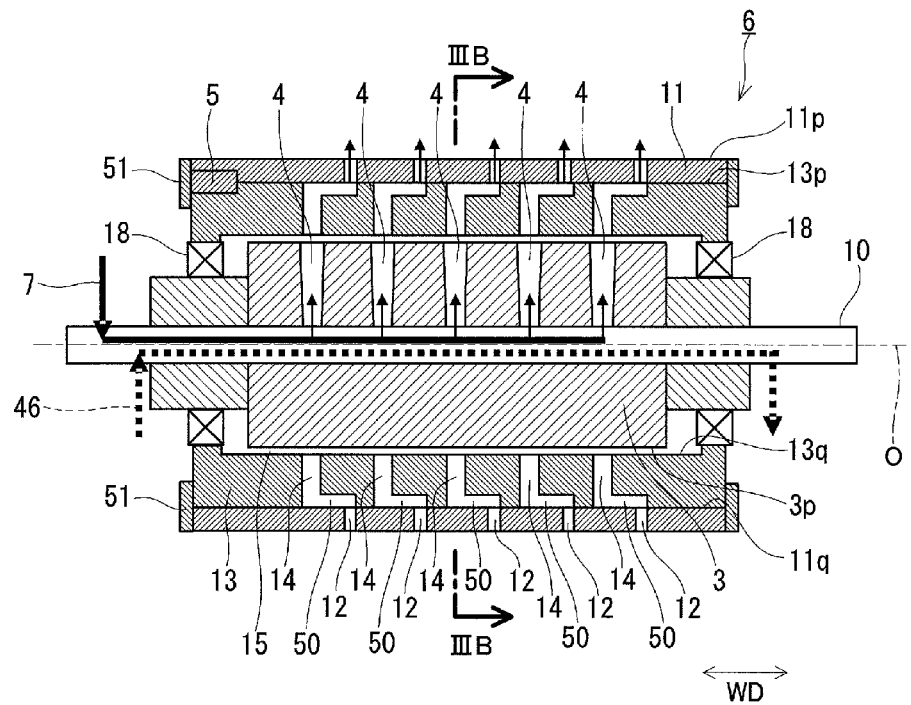
FIG. 3A is a longitudinal cross-sectional view of a blowing roller.
Figure 3B:
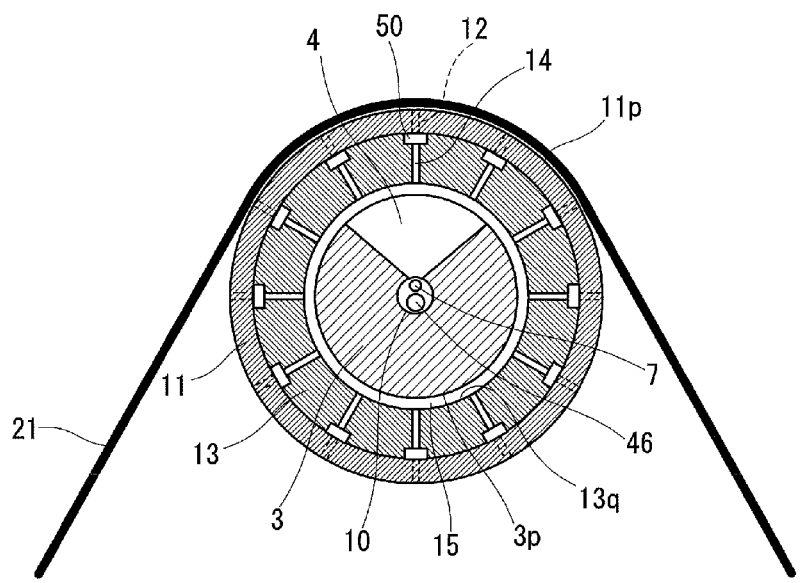
FIG. 3B is a transverse cross-sectional view of a blowing roller taken along a line III B-III B.
Figure 3C:
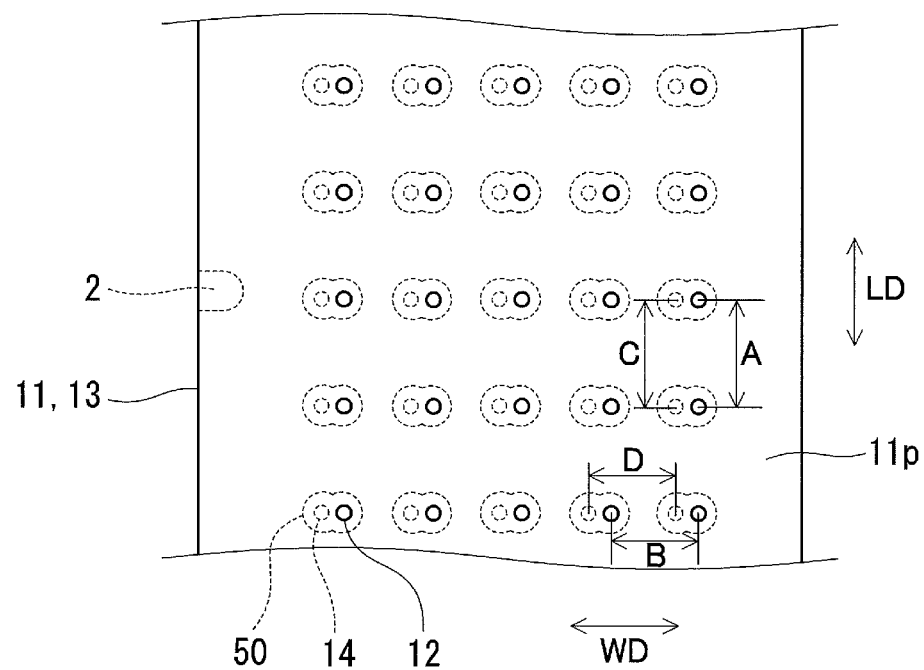
FIG. 3C is a partial development view of a first shell and a second shell.

As shown in FIG. 3A to FIG. 3C, the blowing roller 6 includes a first shell 11, a second shell 13, an internal block 3, a key 5, holding plates 51, a support body 10, and bearings 18. Both the first shell 11 and the second shell 13 have a cylindrical shape. The second shell 13 is disposed inside the first shell 11. The internal block 3 is disposed inside the second shell 13. The first shell 11 and the second shell 13 are rotatably mounted to the internal block 3 via the bearings 18. Manifolds 4 and a clearance 15 are formed inside the second shell 13, i.e., inside the first shell 11.

The first shell 11 has a cylindrical outer circumferential surface 11p for supporting the substrate 21, and has a plurality of first through holes 12 provided along the circumferential direction LD of the outer circumferential surface 11p. The first through holes 12 serve as paths for supplying a gas from the manifolds 4 to the substrate 21. The first shell 11 is configured to rotate in synchronization with the movement of the substrate 21.

The second shell 13 is disposed between the first shell 11 and the internal block 3. The rotational axis of the second shell 13 coincides with the rotational axis O of the first shell 11. The second shell 13 has a plurality of second through holes 14 for guiding a gas from the manifolds 4 to the plurality of first through holes 12 of the first shell 11. The number of the second through holes 14 is not particularly limited.

The rotational axes of the first shell 11 and the second shell 13 may or may not coincide with the center of the internal block 3. For example, the positional relationship between the second shell 13 and the internal block 3 may be set so that the space between an inner circumferential surface 13q of the second shell 13 and an outer circumferential surface 3p of the internal block 3 is relatively wide within the range of a holding angle, and so that the clearance 15 is relatively narrow outside the range of the holding angle.

As shown in FIG. 3A and FIG. 3C, the central axes of the first through holes 12 are offset from the central axes of the second through holes 14. Therefore, foreign matters are less likely to enter between the internal block 3 and the second shell 13. Accordingly, rotational failure of the blowing roller 6 can be prevented, and it is possible to cool the substrate 21 under vacuum while preventing damage to the substrate 21.

The transverse cross-sectional shape of the first through holes 12 and the transverse cross-sectional shape of the second through holes 14 are not limited to a circular shape. That is, the transverse cross-sectional shapes may be a polygonal shape or an elliptical shape. In such cases, the "central axis of the first through hole 12" and the "central axis of the second through hole 14" are determined in accordance with the rule described below. First, the outer circumferential surface 11p of the first shell 11 is viewed in a plane, and an opening of the first through hole 12 is observed. Next, a circle that has the minimum diameter required to enclose the observed opening is determined. An axis passing through the center of the circle and perpendicular to the rotational axis O can be regarded as the "central axis of the first through hole 12". The central axis of the second through hole 14 can be determined in accordance with a similar rule.

The development view of FIG. 3C corresponds to a projection view obtained by developing the first shell 11 and the second shell 13, and projecting (orthogonally projecting) the first shell 11 and the second shell 13 on a plane parallel to the surface 11p of the first shell 11. In the projection view, the outlines (shown by solid lines) of the first through holes 12 are spaced apart from the outlines (shown by dashed lines) of the second through holes 14. That is, the outlines of the first through holes 12 do not intersect the outlines of the second through holes 14. Such a configuration further ensures that foreign matters can be prevented from entering between the internal block 3 and the second shell 13.

The second shell 13 is fixed to the first shell 11 by the key 5 inserted into a key slot 2. Accordingly, the second shell 13 rotates in synchronization with the first shell 11. In the present invention, it is not essential for the first shell 11 and the second shell 13 to rotate in synchronization, and the second shell 13 may be rotatable relative to the first shell 11. However, in the case where both of the shells rotate in synchronization, the relative positional relationship between the first through holes 12 and the second through holes 14 is maintained, and therefore, entry of foreign matters into the second through holes 14 can be prevented more effectively. The second shell 13 may be fixed to the first shell 11 by fixing means other than the key 5. Examples of such fixing means include screws and bolts. Fixing means may be formed by engagement between a part of the second shell 13 and a part of the first shell 11.

Furthermore, in the present embodiment, the second shell 13 has an outer circumferential surface 13p that is in close contact with an inner circumferential surface 11q of the first shell 11. Such a configuration can prevent foreign matters from entering between the first shell 11 and the second shell 13. In addition, since heat is transferred well from the first shell 11 to the second shell 13, the efficiency of cooling the substrate 21 is increased.

As shown in FIG. 3A and FIG. 3B, the second shell 13 further has recesses (countersinks) 50 formed at such positions that the recesses 50 face the first through holes 12. The second through holes 14 open into the recesses 50. With such a configuration, entry of foreign matters into the second through holes 14 can be prevented more effectively.

The internal block 3 is a member that is blocked from rotating in synchronization with the substrate 21. In the present embodiment, the internal block 3 is fixed to the support body 10. For example, the support body 10 is fixed to the vacuum chamber 22. That is, the position and posture of the internal block 3 are fixed relative to the vacuum chamber 22.

The manifolds 4 are spaces defined by the internal block 3 inside the first shell 11 so as to retain a gas introduced from the outside of the vacuum chamber 22. The manifolds 4 are formed so as to guide a gas to the plurality of first through holes 12 within the range of the holding angle. The manifolds 4 have a relatively large size in the radial direction of the first shell 11. Accordingly, the pressure of a gas between the first shell 11 and the substrate 21 is maintained at a relatively high level. In the present embodiment, the plurality of manifolds 4 are formed along the width direction WD of the shells 11 and 13. The second through holes 14 open into the plurality of manifolds 4, respectively. A gas is supplied to each of the plurality of manifolds 4 via a gas flow path 7.

The manifolds 4 are provided within the range of the holding angle. Therefore, the gas emitted from the first through holes 12 through the manifolds 4 can easily be confined between the first shell 11 and the substrate 21. More desirably, the manifolds 4 are defined within a region located inward by a pitch A (see FIG. 3) or more from both ends of the range of the holding angle. In this case, the gas emitted from the first through holes 12 through the manifolds 4 can more easily be confined between the first shell 11 and the substrate 21.

For example, the manifolds 4 are each formed by hollowing a part of the internal block 3, and communicate with the second through holes 14, the recesses 50, the first through holes 12, and the gas flow path 7 formed inside the support body 10. The conductance of the gas flow route from the gas flow path 7 to each first through hole 12 can be independently set by changing the shape of each manifold 4 as necessary. In addition, the angle of emission from each first through hole 12 can be independently adjusted in the width direction of the substrate 21. Therefore, the intensity of gas cooling in the width direction of the substrate 21 can be varied.

For example, in many cases where a thin film is formed using a vacuum process, thermal load applied to the central region in the width direction of the substrate 21 is larger than thermal load applied to the edge region in the width direction of the substrate 21. This is because thermal load resulting from radiation heat is larger around the central region of the substrate 21 than in the edge region even when the thin film has a uniform thickness. In such a case, the conductance of the plurality of manifolds 4 may be designed so that the amount of the gas emitted from the blowing roller 6 through the manifolds 4, the second through holes 14, and the first through holes 12 is relatively large in the central region of the substrate 21, and is relatively small in the edge region of the substrate 21. In this manner, the cooling intensity can be varied in accordance with thermal load applied to the substrate 21. The temperature distribution in the width direction of the substrate 21 can be made narrow, and thermal deflection of the substrate 21 or the like can be reduced.

In the present specification, the phrase "within the range of the holding angle" is intended to include the case where, in the circumferential direction of the first shell 11, one end or both ends of the range of the holding angle coincide with one end or both ends of the range over which the manifolds 4 extend. As used herein, the term "coincide" does not mean exact coincidence. For example, even when the manifolds 4 extend beyond the range of the holding angle by an angle of about 2 to 3 degrees in terms of the rotational angle of the first shell 11, such non-coincidence is considered to be within the margin of error, and one end or both ends of the range of the holding angle are deemed to coincide with one end or both ends of the range over which the manifolds 4 extend.

The clearance 15 is also a space formed inside the first shell 11, and is formed so as to guide a gas to the plurality of first through holes 12 outside the range of the holding angle (specifically, outside the range of a specific angle). Specifically, the clearance 15 is formed between the second shell 13 and the internal block 3. The clearance 15 has a relatively small size in the radial direction of the first shell 11.

The width of the clearance 15 in the radial direction is in a range of, for example, 30 to 200 μm. When the width of the clearance 15 is appropriately adjusted, the amount of the gas leaking to the outside of the blowing roller 6 through the clearance 15 can be reduced, and thus deterioration in the degree of vacuum can be prevented. In addition, it is possible to avoid contact between the second shell 13 and the internal block 3 that occurs due to, for example, processing accuracy of components or deformation by thermal expansion, and it is thus possible to prevent abnormal rotation and damage to the blowing roller 6.

Figure 4:
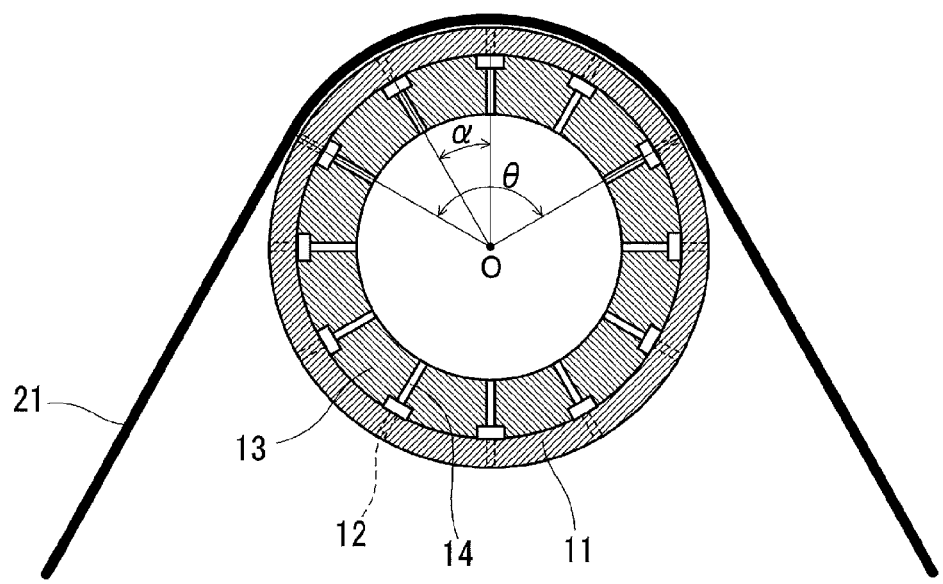
FIG. 4 is a diagram illustrating a holding angle.

As shown in FIG. 4, "the holding angle" is defined as an angle θ that is formed by the contact portion between the first shell 11 and the substrate 21 and that has the vertex on the rotational axis O of the first shell 11. The magnitude of the holding angle is not particularly limited. For example, in the case where the holding angle is in a range of 30 to 180 degrees (or 45 to 120 degrees), even when the outer diameter of the first shell 11 is somewhat small, no excessive bending stress is generated, and the substrate 21 can be conveyed smoothly.

As shown in FIG. 1, the conveyance system 36A includes a first roller disposed upstream of the blowing roller 6 along the conveyance direction of the substrate 21, and a second roller disposed downstream of the blowing roller 6 along the conveyance direction of the substrate. The holding angle is defined by the relative positional relationship among the first roller, the blowing roller 6, and the second roller. In the apparatus 20A for producing thin films which is shown in FIG. 1, the "first roller" is the spool roller 23 or one of the conveying rollers 24. The "second roller" is the other of the conveying rollers 24 or the spool roller 26. Here, it is assumed that the manifolds 4 are formed so as to guide a gas to the plurality of first through holes 12 within the range of the specific angle whose vertex is on the rotational axis O of the first shell 11. The conveyance system 36A can be constructed so that the "specific angle" falls within the holding angle. That is, the "specific angle" is smaller than or equal to the holding angle.

For production of thin films, the conveyance system 36A is first constructed inside the vacuum chamber 22. The substrate 21 is conveyed from an unwinding position (spool roller 23) to a winding position (spool roller 26) in the conveyance system 36A. A material is evaporated from the film formation source 19 toward the opening 31 provided in the conveyance route of the conveyance system 36A, and is thus applied onto the substrate 21. In the process of constructing the conveyance system 36A, the relative positional relationship among the first roller (spool roller 23), the blowing roller 6, and the second roller (conveying roller 24) is set so that the "specific angle" falls within the holding angle.

As shown in FIG. 4, the holding angle defined as the angle θ is larger than an angle α between two lines each connecting the rotational axis O to the center of one or the other of two second through holes 14 adjacent to each other in the circumferential direction. Such a relationship can ensure that at least one of the plurality of second through holes 14 faces the manifold 4.

In the present embodiment, the range (angular range) over which the manifold 4 extends in the circumferential direction is defined so that the manifold 4 faces the plurality of second through holes 14 only within the range of the holding angle. With this configuration, the pressure of a gas between the first shell 11 and the substrate 21 can easily be maintained at a high level.

As shown in FIG. 3B, the internal block 3 has the arc-shaped outer circumferential surface 3p outside the range of the holding angle. The clearance 15 is formed between the arc-shaped outer circumferential surface 3p of the internal block 3 and the inner circumferential surface 13q of the second shell 13. With this configuration, the width of the clearance 15 can easily be made constant. That is, the width of the clearance 15 may be constant. The portion having a constant width can be regarded as the clearance 15, and the rest can be regarded as the manifold 4.

As shown in FIG. 3A and FIG. 3C, the first through holes 12 are formed at regular intervals along the width direction WD of the first shell 11. Similarly, the second through holes 14 are formed at regular intervals along the width direction WD of the second shell 13. This can ensure the uniformity of the cooling performance in the width direction. As shown in FIG. 3B and FIG. 3C, the first through holes 12 are formed at regular intervals along the circumferential direction LD. Similarly, the second through holes 14 are formed at regular intervals along the circumferential direction LD. This can ensure the uniformity of the cooling performance in the circumferential direction.

Figure 5A:
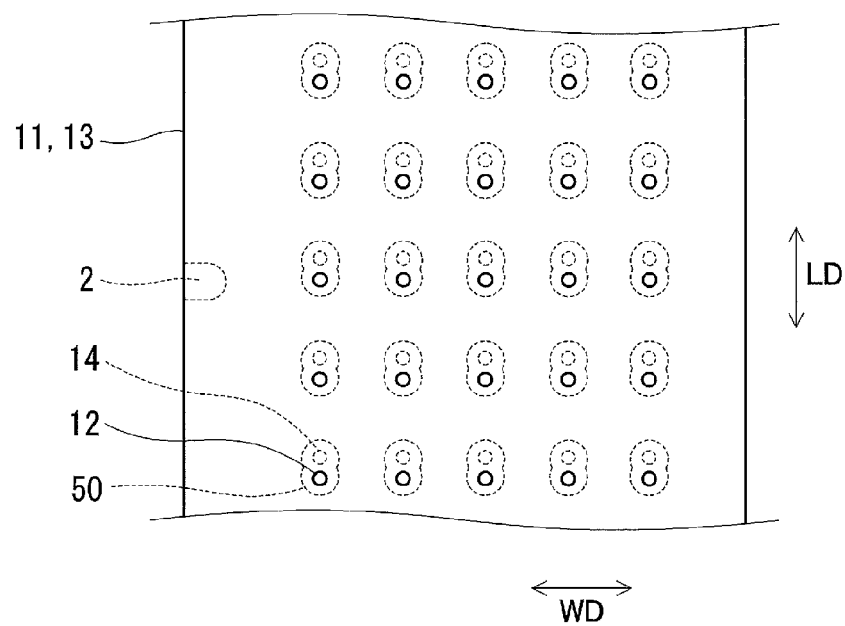
FIG. 5A is another partial development view of a first shell and a second shell.

As shown in FIG. 3C, the length direction of the recesses 50 is parallel to the width direction WD. One first through hole 12 faces one recess 50, and one second through hole 14 opens into one recess 50. That is, the first through hole 12 and the second through hole 14 paired with each other are aligned in the width direction WD. In such a positional relationship, even when the first shell 11 and the second shell 13 can rotate relative to each other, foreign matters are less likely to enter the second through holes 14. As shown in FIG. 5A, the length direction of the recesses 50 may be parallel to the circumferential direction LD.

The shape of the recesses 50 is not particularly limited. The depth of each recess 50 may gradually increase from a position at which the second through hole 14 opens into the recess 50 to a position at which the recess 50 faces the first through hole 12. Here, a virtual straight line is defined which passes through the central axis of the first through hole 12 and the central axis of the second through hole 14, and which is orthogonal to these central axes. When viewed in a cross section perpendicular to the virtual straight line, the recess 50 may have a V-shaped, semi-circular, semi-elliptical, or rectangular outline.

In the present specification, the width direction WD is the width direction of the first shell 11 and the second shell 13, and means a direction parallel to the rotational axis O. The circumferential direction LD is the circumferential direction of the outer circumferential surface 11$p$ of the first shell 11, and is also the circumferential direction of the outer circumferential surface 13$p$ of the second shell 13.

Figure 5B:
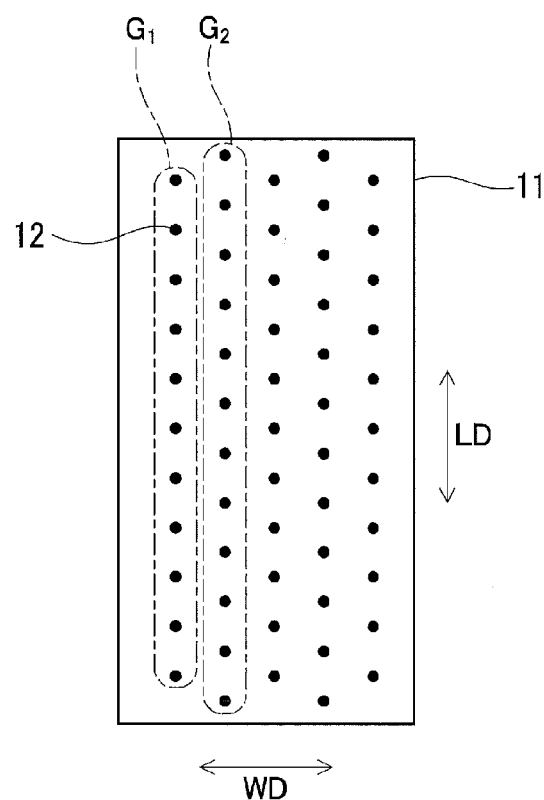
FIG. 5B is still another development view of a first shell.

The arrangement of the first through holes 12 and the arrangement of the second through holes 14 are not particularly limited, as long as the substrate 21 can be uniformly cooled. In FIG. 5B, for example, the plurality of first through holes 12 constitute: (i) a first group $G_1$ provided along the circumferential direction LD at a predetermined position in the width direction WD parallel to the rotational axis O; and (ii) a second group G2 provided along the circumferential direction LD at a position adjacent to the predetermined position. The first through holes 12 belonging to the first group G1 and the first through holes 12 belonging to the second group G2 are arranged in a staggered manner. That is, in the development view of the first shell 11, the first through holes 12 are located at lattice points in a staggered lattice. Such arrangement of the first through holes 12 allows more uniform cooling.

As shown in FIG. 3A, the support body 10 is a member supporting the internal block 3, has the gas flow path 7 (gas introduction port) for introducing a gas into the manifolds 4 from the outside of the vacuum chamber 22, and has a refrigerant flow path 46 for flowing a refrigerant for cooling the support body 10. The gas flow path 7 may be constituted by a single flow path that allows supply of only one type of gas to the manifolds 4, or may be constituted by a plurality of flow paths so that a plurality of types of gases can be supplied to the manifolds 4.

Furthermore, in the case where the plurality of manifolds 4 are formed, the gas flow path 7 may be configured so that the amount of the gas supplied to one manifold 4 and the amount of the gas supplied to another manifold can be made different from each other.

The gas is supplied through the gas supply pipe 32 and the gas flow path 7, and fills the manifolds 4 formed in the internal block 3. The gas is guided preferentially to the second through holes 14 that face the manifolds 4, guided to the first through holes 12 through the recesses 50, and emitted from the first through holes 12 toward the back surface of the substrate 21.

The blowing roller 6 performs cooling of the substrate 21. Accordingly, the water flow path 46 (refrigerant flow path) for a coolant water is desirably provided in the support body 10 in order to prevent temperature increase. Cooling means is not limited to water, and a liquid or gaseous refrigerant can be used. Water is supplied to the water flow path 46 from the outside of the vacuum chamber 22. The water having flowed through the water flow path 46 is returned to the outside of the vacuum chamber 22.

It is not essential that the support body 10 and the internal block 3 are components that are separate from each other. A portion of the internal block 3 may project from the first shell 11, and the projecting portion may serve as the support body 10. That is, the support body 10 and the internal block 3 may be formed integrally with each other.

Figure 6:
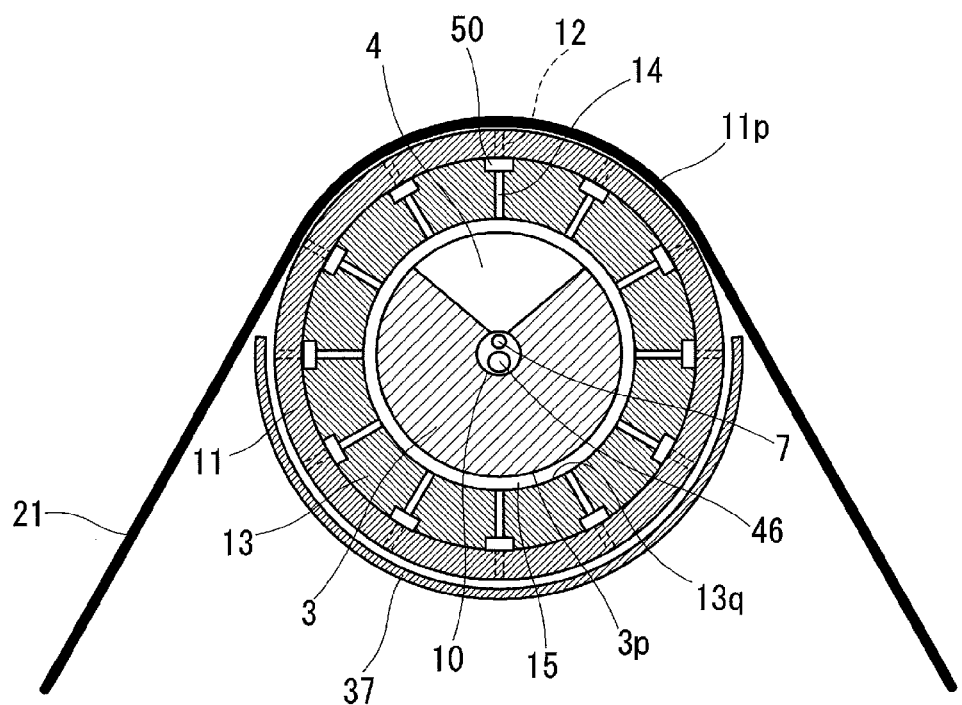
FIG. 6 is a transverse cross-sectional view showing the position and shape of a gas leakage reducing member.

As shown in FIG. 6, a gas leakage reducing member 37 facing the outer circumferential surface 11$p$ of the first shell 11 may be provided. In this case, gas leakage outside the range of the holding angle can be reduced. For example, the gas leakage reducing member 37 is a curved plate provided outside the range of the holding angle and located within 50 to 300 μm from the first shell 11. For example, the gas leakage reducing member 37 has the shape of an arc extending along the outer circumferential surface 11$p$ of the first shell 11. The gas leakage reducing member 37 can be provided outside the range of the holding angle at such a position that the gas leakage reducing member 37 faces the outer circumferential surface 11$p$ of the first shell 11.

As shown in FIG. 3A, the holding plates 51 are disposed on both end surfaces of the first shell 11 and the second shell 13 in such a way as to close a slight gap between the first shell 11 and the second shell 13. When the blowing roller 6 is in use, the temperature of the first shell 11 is higher than the temperature of the second shell 13. Therefore, there is a possibility that the gap between the first shell 11 and the second shell 13 is slightly widened due to thermal expansion, leading to gas leakage. The holding plates 51 have the effect of preventing gas leakage caused by widening of the gap.

When the material of the first shell 11 has a thermal expansion coefficient smaller than the thermal expansion coefficient of the material of the second shell 13, the following effect can be obtained. That is, even if the temperature of the first shell 11 becomes higher than the temperature of the second shell 13 when the blowing roller 6 is in use, widening of the gap between the first shell 11 and the second shell 13 can be suppressed. For example, it is assumed that the first shell 11 is made of SUS 430, and the second shell 13 is made of SUS 304. The linear expansion coefficient of SUS 430 has an average value of $1.04 \times 10^{-5}$/° C. in the temperature range from 0 to 100° C. The linear expansion coefficient of SUS 304 has an average value of $1.73 \times 10^{-5}$/° C. in the temperature range from 0 to 100° C. The inner diameter of the first shell 11 and the outer diameter of the second shell 13 are set to about 100 mm, and the first shell 11 and the second shell 13 are fitted to each other by transition fit. As the temperatures of the first shell 11 and the second shell 13 increase up to 50° C. and 40°

C., respectively, the inner diameter of the first shell 11 changes from 100.035 mm to 100.063 mm, and the outer diameter of the second shell 13 changes from 99.965 mm to 99.994 mm. The width of the gap between the first shell 11 and the second shell 13 changes from 0.07 mm to 0.069 mm. That is, the gap is hardly widened.

Next, suitable dimensions of each component, and the like, will be described.

In the present embodiment, the second shell 13 is fixed to, and in close contact with, the first shell 11. Specifically, the second shell 13 is incorporated to the inside of the first shell 11 with a predetermined fitting accuracy (e.g., by transition fit), and the second shell 13 is fixed by the key 5 so as not to rotate relative to the first shell 11. The outer diameter of the first shell 11 is in a range of, for example, 40 to 1000 mm. When the outer diameter of the first shell 11 is in such a range, equipment cost can be reduced, and at the same time, sufficient cooling performance can be obtained. In addition, grinding process for forming the inner circumferential surface 11$q$ of the first shell 11 is made easier. The length of the first shell 11 in the axial direction is in a range of, for example, 100 to 800 mm. The length of the first shell 11 in the axial direction should be greater than the width of the substrate 21 in order for the substrate 21 to travel stably. When the outer diameter and the length in the axial direction of the first shell 11 are appropriately adjusted, the accuracy of the gap between the first shell 11 and the second shell 13 can be appropriately maintained. The thickness of the first shell 11 in the region where the first through holes 12 are formed is in a range of, for example, 2 to 15 mm. When the thickness of the first shell 11 is in such a range, deformation of the first shell 11 can be prevented. In addition, the process for forming the first through holes 12 is easy.

The diameter of the first through holes 12 is set as appropriate depending on, for example, the conditions for cooling the substrate 21 and the degree of vacuum. The diameter of the first through holes 12 is in a range of, for example, 0.5 to 3 mm. When the diameter of the first through holes 12 is appropriately set, gas leakage can be minimized. In addition, the process for forming the first through holes 12 is made easier.

As shown in FIG. 3C, the pitch A of the first through holes 12 denotes an interval between two first through holes 12 adjacent to each other in the circumferential direction LD. A pitch B of the first through holes 12 denotes an interval between two first through holes 12 adjacent to each other in the width direction WD. The pitch A and the pitch B are also set as appropriate depending on, for example, the conditions for cooling the substrate 21 and the degree of vacuum. The pitch A is in a range of, for example, 10 to 50 mm. The pitch A may be in a range of, for example, 5 to 30 degrees in terms of the rotational angle of the first shell 11. Appropriate adjustment of the pitch A can reduce the pressure variation that depends on the rotational angle of the first shell 1, and can improve the uniformity of cooling performance. In addition, since an appropriate number of first through holes 12 are formed, increase in processing cost can also be prevented. The pitch B is in a range of, for example, 10 to 200 mm. The pitch B need not be constant along the width direction WD. That is, the first through holes 12 need not be arranged at a regular interval along the width direction WD. The pitch B can be adjusted as appropriate depending on the temperature of the substrate 21 and the cooling state of the substrate 21. Appropriate adjustment of the pitch B can improve the uniformity of cooling performance in the width direction WD. In addition, since an appropriate number of first through holes 12 are formed, increase in processing cost can also be prevented.

The outer diameter of the second shell 13 is determined based on the inner diameter of the first shell 11 and the fitting accuracy. For example, the inner diameter of the first shell 11 can be set to H7, and the outer diameter of the second shell 13 can be set to h7. Here, "H7" and "h7" mean dimensional tolerances specified in Japanese Industrial Standards JIS B 0401 (1999). When the outer diameter of the second shell 13 is appropriately adjusted, equipment cost can be reduced, and at the same time, sufficient cooling performance can be obtained. In addition, the grinding process for the inner circumferential surface of the second shell 13 is made easier. The length of the second shell 13 in the axial direction is determined depending on the length of the first shell 11 in the axial direction. The length of the second shell 13 in the axial direction is in a range of, for example, 100 to 800 mm. When the outer diameter and the length in the axial direction of the second shell 13 are appropriately adjusted, the accuracy of the gap between the first shell 11 and the second shell 13 can be appropriately maintained. The thickness of the second shell 13 in the region where the second through holes 14 are formed is in a range of, for example, 5 to 15 mm. When the thickness of the second shell 13 is in such a range, deformation of the second shell 13 can be prevented. In addition, the process for forming the second through holes 14 is easy. The depth of the recesses 50 is in a range of, for example, 2 to 5 mm. When the depth of the recesses 50 is appropriately adjusted, foreign matters are likely to be caught by the recesses 50. In the case where the depth of a portion of each recess 50 is increased as described later, the depth of the portion is in a range of, for example, 5 to 10 mm. The width of the recesses 50 is desirably larger than the diameter of the first through holes 12. In this case, the conductance of the gas flow path can easily be optimized. The width of the recesses 50 is in a range of, for example, 3 to 5 mm.

The diameter of the second through holes 14 is set as appropriate depending on, for example, the conditions for cooling the substrate 21 and the degree of vacuum. The diameter of the second through holes 14 is in a range of, for example, 0.1 to 3 mm. Appropriate adjustment of the diameter of the second through holes 14 can reduce the probability that foreign matters having passed through the first through holes 12 further pass through the second through holes 14, and enter between the second shell 13 and the internal block 3. In addition, the process for forming the second through holes 14 is made easier. In this viewpoint, the second through holes 14 may have a diameter smaller than the diameter of the first through holes 12. In this case, even when foreign matters pass through the first through holes 12, the foreign matters can be blocked by the second through hole 14. Consequently, it is possible to further reduce the probability that foreign matters enter between the second shell 13 and the internal block 3.

As shown in FIG. 3C, a pitch C of the second through holes 14 denotes an interval between two second through holes 14 adjacent to each other in the circumferential direction LD. A pitch B of the second through holes 14 denotes an interval between two second through holes 14 adjacent to each other in the width direction WD. The pitch C and the pitch D are set in conformity with the pitch A and the pitch B of the first through holes 12. That is, the pitches are determined so that the central axis of the first through hole 12 and the central axis of the second through hole 14 are not aligned in the same straight line. In the present embodiment, the recesses 50 of the second shell 13 are present on extended lines of the central axes of the first through holes 12.

Next, other examples of the shapes of the first through holes 12, the second through holes 14, and the recesses 50, will be described in detail.

Figure 7A:
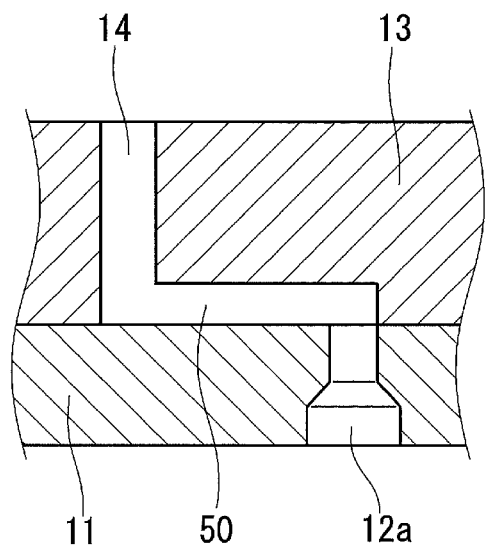
FIG. 7A is a partially enlarged cross-sectional view showing another example of the shapes of a first through hole and a second through hole.
Figure 7B:
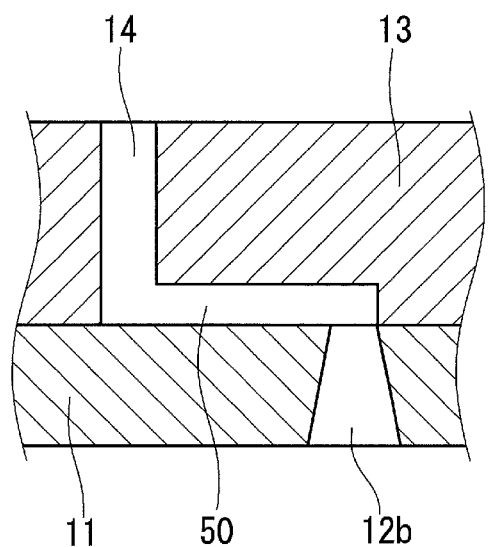
FIG. 7B is a partially enlarged cross-sectional view showing still another example of the shapes of a first through hole and a second through hole.

As shown in FIG. 7A to FIG. 7E, the first through hole 12 may have a diameter decreasing from an outer circumference side of the first shell 11 toward a center side of the first shell 11. When the first through hole 12 has such a shape, the effect of preventing entry of foreign matters is enhanced. As shown in FIG. 7B, the diameter of the first through hole 12 may vary continuously. Alternatively, the diameter of the first through hole 12 may vary in a stepwise fashion. Furthermore, as shown in FIG. 7A, the first through hole 12 may have a portion in which the diameter varies continuously, and a portion in which the diameter is constant.

Figure 7C:
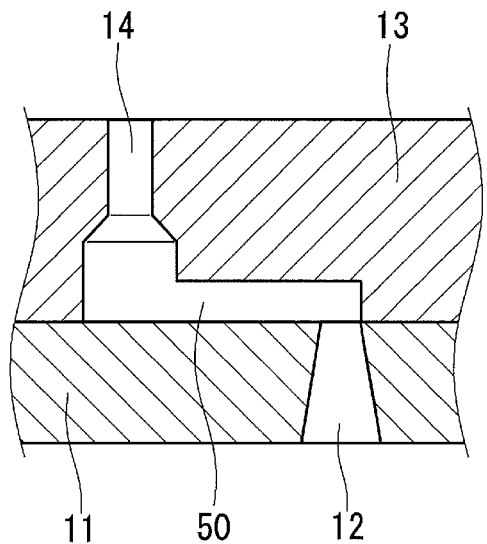
FIG. 7C is a partially enlarged cross-sectional view showing still another example of the shapes of a first through hole and a second through hole.
Figure 7D:
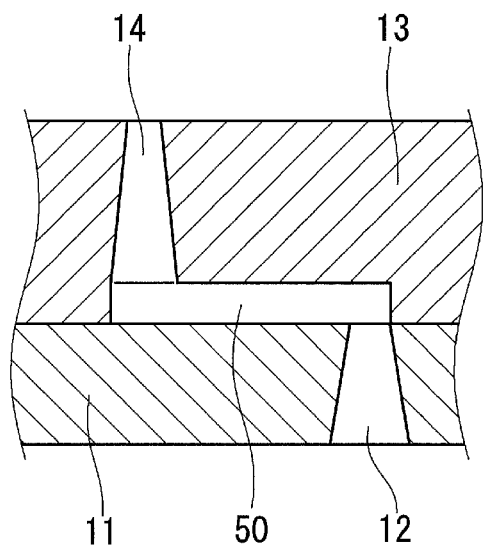
FIG. 7D is a partially enlarged cross-sectional view showing still another example of the shapes of a first through hole and a second through hole.
Figure 7E:
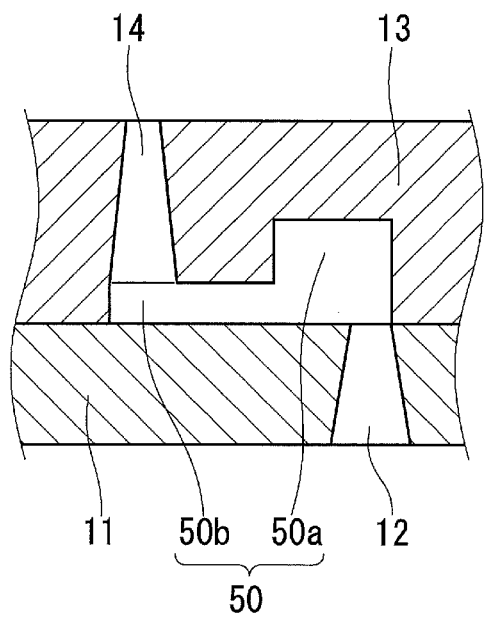
FIG. 7E is a partially enlarged cross-sectional view showing still another example of the shapes of a first through hole and a second through hole.

Similarly, as shown in FIG. 7C to FIG. 7E, the second through hole 14 may have a diameter decreasing from an outer circumference side of the second shell 13 toward a center side of the second shell 13. When the second through hole 14 has such a shape, the effect of preventing entry of foreign matters is enhanced. As shown in FIG. 7D and FIG. 7E, the diameter of the second through holes 14 may vary continuously. Alternatively, the diameter of the second through hole 14 may vary in a stepwise fashion. Furthermore, as shown in FIG. 7C, the second through hole 1 may have a portion in which the diameter varies continuously, and a portion in which the diameter is constant.

Figure 7F:
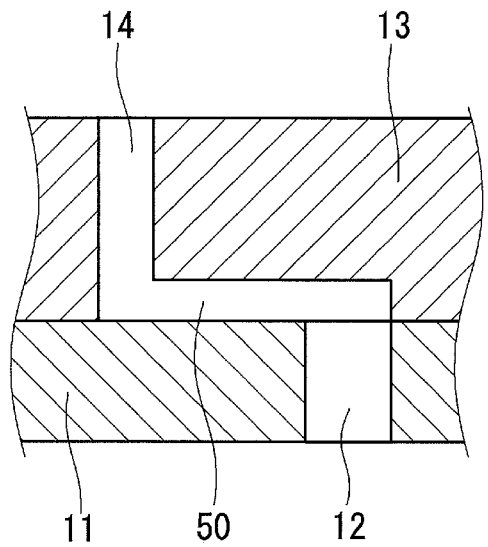
FIG. 7F is a partially enlarged cross-sectional view showing still another example of the shapes of a first through hole and a second through hole.

As shown in FIG. 7F, a portion of the second through hole 14 that is located on an outer circumference side of the second shell 13 may have a smaller diameter than a portion of the first through hole 12 that is located on a center side of the first shell 11. When there is such a relationship, foreign matters smaller than the diameter of the first through hole 12 and larger than the diameter of the second through hole 14 can be prevented from entering the clearance 15.

As shown in FIG. 7E, the recess 50 may include a first portion 50*a* located on an extended line of the central axis of the first through hole 12, and a second portion 50*b* into which the second through hole 14 opens. The first portion 50*a* is deeper than the second portion 50*b*. With such a configuration, foreign matters are likely to be caught by the first portion 50*a*. Therefore, even when foreign matters can pass through the first through hole 12, the foreign matters are less likely to reach the second through hole 14.

In the blowing roller 6 described above, the first through holes 12, the recesses 50, and the second through holes 14 move with the rotation of the first shell 11 and the second shell 13 while facing the manifolds 4 or the clearance 15. The conductance of the gas flow route from the gas flow path 7 to the first through holes 12 is larger when the gas flows via the manifolds 4 than when the gas flows via the clearance 15. Therefore, in the absence of the substrate 21, the amount of the gas passing outward through the first through hole 12 facing the manifolds 4 is larger than the amount of the gas passing through the first through hole 12 facing the clearance 15. Accordingly, the gas can be emitted efficiently from the first through holes 12 situated within the range of the holding angle over which the blowing roller 6 contacts the substrate 21. Thus, the gas pressure between the first shell 11 and the substrate 21 can be increased.

In the presence of the substrate 21, the gas having a high pressure is present between the first shell 11 and the substrate 21 within the range of the holding angle. Accordingly, the first shell 11 can efficiently receive heat from the substrate 21. Meanwhile, outside the range of the holding angle, the first shell 11 and the internal block 3 are located close to each other across the second shell 13, and the gas is retained between the second shell 13 and the internal block 3. Therefore, the first shell 11 and the second shell 13 are efficiently cooled by the internal block 3. In this manner, the first shell 11 periodically repeats cooling of the substrate 21 and heat dissipation to the internal block 3 while the first shell 11 is rotating. Therefore, stable cooling operation can be performed for a long period of time.

When the average pressure generated between the outer circumferential surface 11*p* of the first shell 11 and the substrate 21 as a result of introduction of the gas is adjusted to be lower than the atmospheric pressure, the amount of the gas leaking from the gap between the outer circumferential surface 11*p* of the first shell 11 and the substrate 21 can be reduced. This can reduce the load on the evacuation pumps 35.

In addition, since the amount of the gas introduced is small, the buoyancy resulting from the average pressure between the outer circumferential surface 11*p* of the first shell 11 and the substrate 21 is smaller than the normal force which is exerted by the substrate 21 on the blowing roller 6 due to the conveyance tension of the substrate 21. Therefore, a difference in the width of the gap present between the outer circumferential surface 11*p* of the first shell 11 and the substrate 21 is, for example, 100 μm or less between when the gas is introduced and when the gas is not introduced. That is, lifting of the substrate 21 can be prevented, and cooling of the substrate 21 can be efficiently carried out.

With the blowing roller 6 of the present embodiment, even when foreign matters enter the first through holes 12, entry of the foreign matters into the manifolds 4 and the clearance 15 can be blocked. This can prevent the substrate 21 from incurring abrasion damage due to locking of the blowing roller 6. In addition, the gas pressure between the blowing roller 6 and the substrate 21 can be increased while the gas is introduced. Furthermore, since a cooling function can be achieved on a compact scale, it is possible to prevent, for example, increase in the size of equipment and increase in the cost.

In the case where no gas is flowed in the gas flow path 7, foreign matters enter the first through holes 12 when, for example, the inside of the apparatus 20A or 20B for producing thin films is being cleaned in a state where the vacuum chamber 22 is open to the atmosphere, or a material is being deposited on the substrate 21 being conveyed. Examples of the foreign matters include dust and the material deposited on the substrate 21. The foreign matters can be removed by opening the vacuum chamber 22 to the atmosphere, introducing a compressed air (e.g., 0.3 MPa) into the gas flow path 7, and rotating the first shell 11 manually.

Hereinafter, blowing rollers according to modifications will be described. In the modifications described below, the same components as those of the blowing roller 6 described with reference to FIG. 1 to FIG. 7 are denoted by the same reference numerals, and the description thereof is omitted.

(Modification 1)

Figure 8:
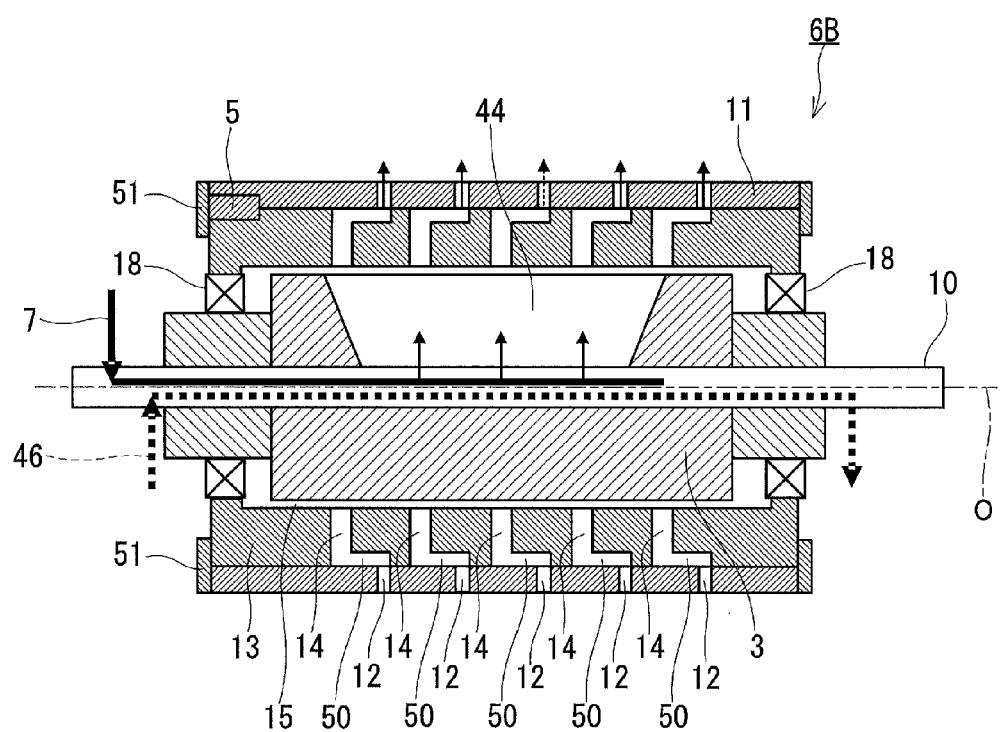
FIG. 8 is a longitudinal cross-sectional view of a blowing roller according to a modification 1.

As shown in FIG. 8, a blowing roller 6B according to a modification 1 has a manifold 44 of large width. Only one manifold 44 is formed in the internal block 3. With such a configuration, the cost of the internal block 3 can be reduced. The width (the length in a direction parallel to the rotational axis O) of the manifold 44 is adjusted so that a gas can be smoothly guided to each of the plurality of second through holes 14 arranged in the direction (width direction WD) parallel to the rotational axis O. Specifically, the width of the manifold 44 is larger than the distance between two second through holes 14 located at both ends in the width direction WD.

(Modification 2)

Figure 9:
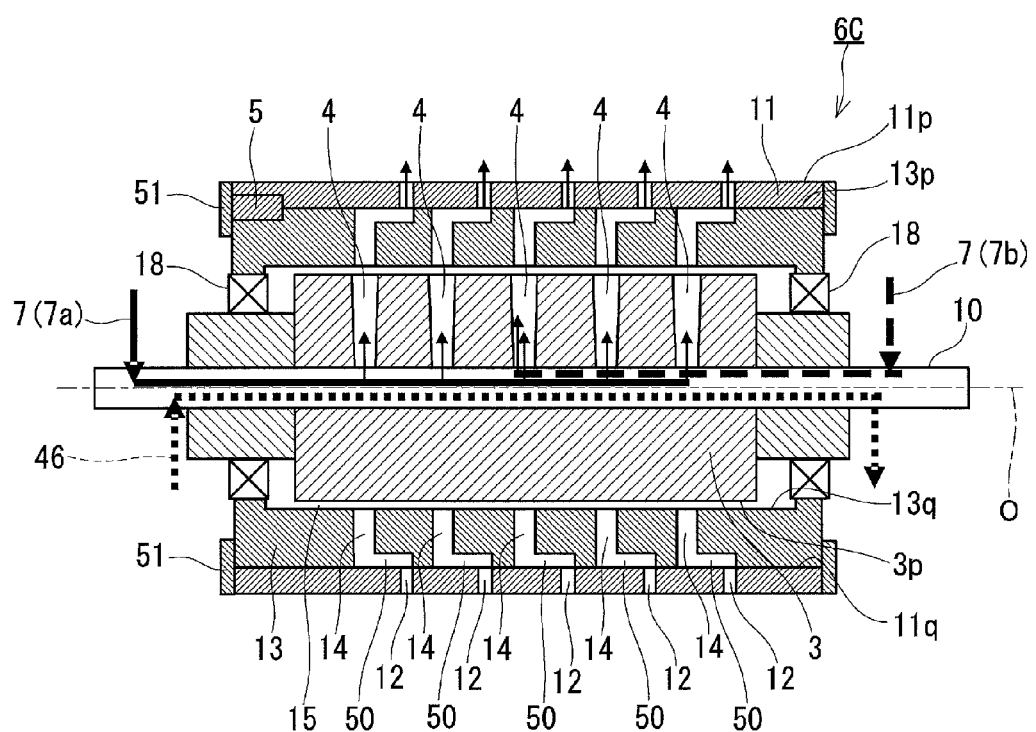
FIG. 9 is a longitudinal cross-sectional view of a blowing roller according to a modification 2.

As shown in FIG. 9, a blowing roller 6C according to a modification 2 includes a plurality of flow paths in the gas flow path 7. The gas flow path 7 includes a first gas flow path 7a communicating with all the plurality of manifolds 4, and a second gas flow path 7b communicating with the manifold 4 formed inwardly from the manifolds 4 located at end portions. Specifically, the second gas flow path 7b communicates with at least one of the plurality of manifolds 4 that are formed inwardly from two manifolds 4 located at both ends in the width direction. This makes it possible to vary the amount of the gas introduced into the manifolds 4 in the width direction of the substrate 21, and to vary the cooling intensity depending on thermal load applied to the substrate 21. In addition, the type of the gas introduced into the first gas flow path 7a can be different from the type of the gas introduced into the second gas flow path 7b. For example, when thermal load on the central region of the substrate 21 is large, in particular, when a metal foil substrate is used, the central region of the substrate 21 is likely to be stretched. Therefore, the central region of the substrate 21 is likely to lift slightly from the blowing roller 6C. In such a case, for example, argon gas is used for the first gas flow path 7a, while helium gas is used for the second gas flow path 7b. Although helium gas is expensive, molecular collision is less likely to occur in helium gas. Therefore, cooling performance can easily be obtained even when the gap between the blowing roller 6C and the substrate 21 is wide. Accordingly, even when the substrate 21 is lifted somewhat from the blowing roller 6C, the substrate 21 can be cooled with a focus on the central region and its vicinity.

(Modification 3)

Figure 10:
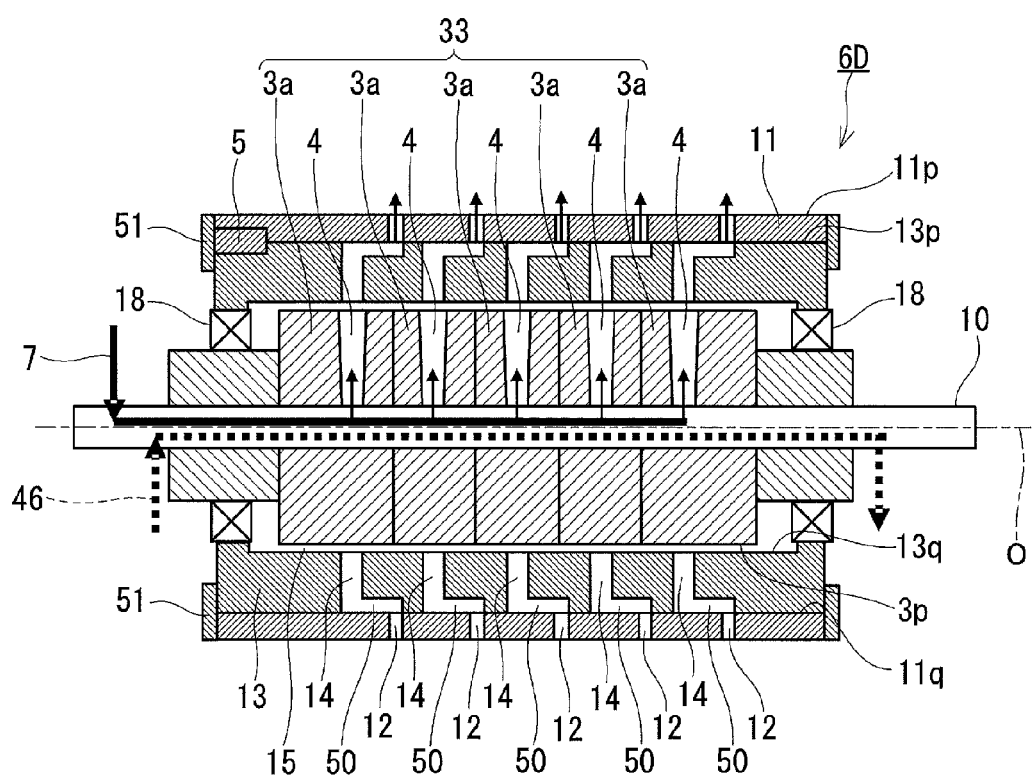
FIG. 10 is a longitudinal cross-sectional view of a blowing roller according to a modification 3.

As shown in FIG. 10, a blowing roller 6D according to a modification 3 includes an internal block 33 constituted by a plurality of separate blocks 3a. The separate blocks 3a are arranged along the rotational axis O. The manifold 4 is formed in each separate block 3a. With such a configuration, the structure of the blowing roller 6D can be changed depending on the desired cooling conditions. That is, the cooling conditions can easily be changed by reassembling the separate blocks 3a in a different way.

(Modification 4)

Figure 11A:
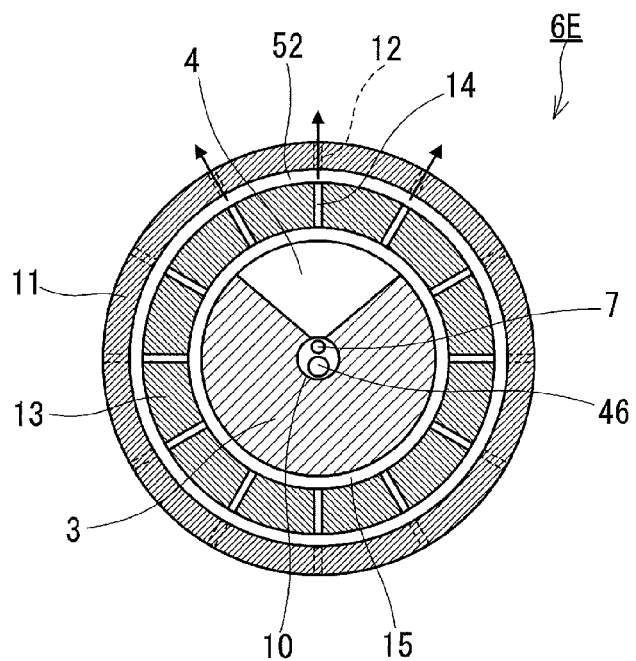
FIG. 11A is a transverse cross-sectional view of a blowing roller according to a modification 4.
Figure 11B:
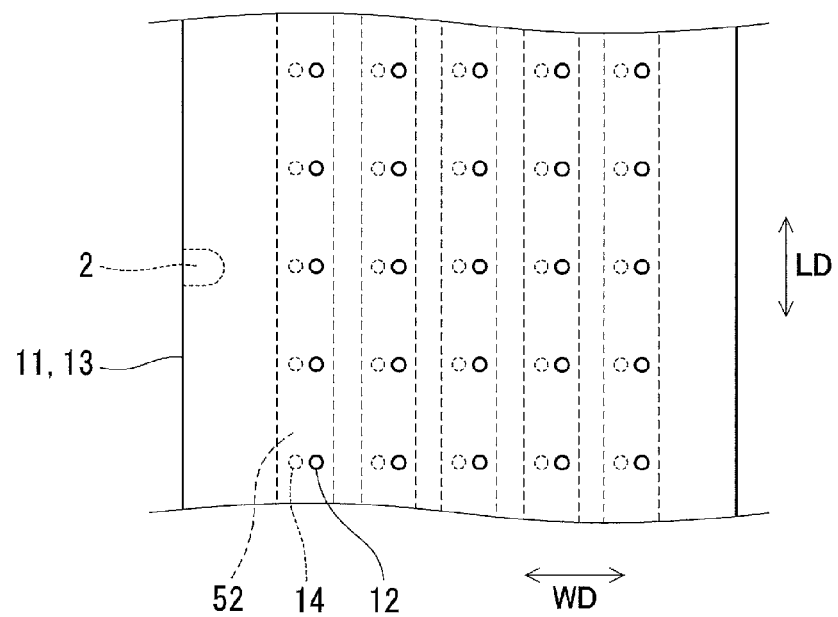
FIG. 11B is a partial development view of a first shell and a second shell according to the modification 4.

As shown in FIG. 11A and FIG. 11B, in a blowing roller 6E according to a modification 4, the second shell 13 has groove-shaped recesses 52 extending parallel to the circumferential direction LD. The recesses 52 may be formed over the entire circumference of the second shell 13. The plurality of recesses 52 are arranged in a row along the width direction WD. The distance between adjacent recesses 52 may be constant or may vary. A plurality of first through holes 12 face one recess 52. Similarly, a plurality of second through holes 14 open into one recess 52. With such a configuration, the process for forming the recesses 52 of the second shell 13 by machining can avoid being complicated, and thus the cost of fabricating the blowing roller 6E can be reduced.

(Modification 5)

Figure 12A:
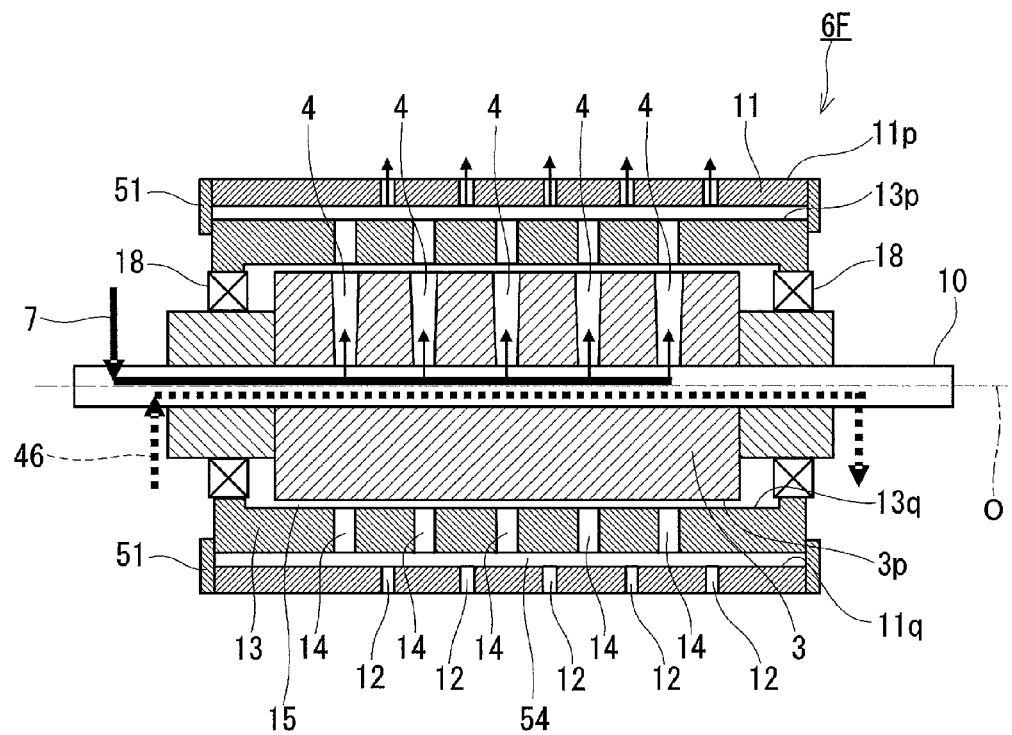
FIG. 12A is a longitudinal cross-sectional view of a blowing roller according to a modification 5.
Figure 12B:
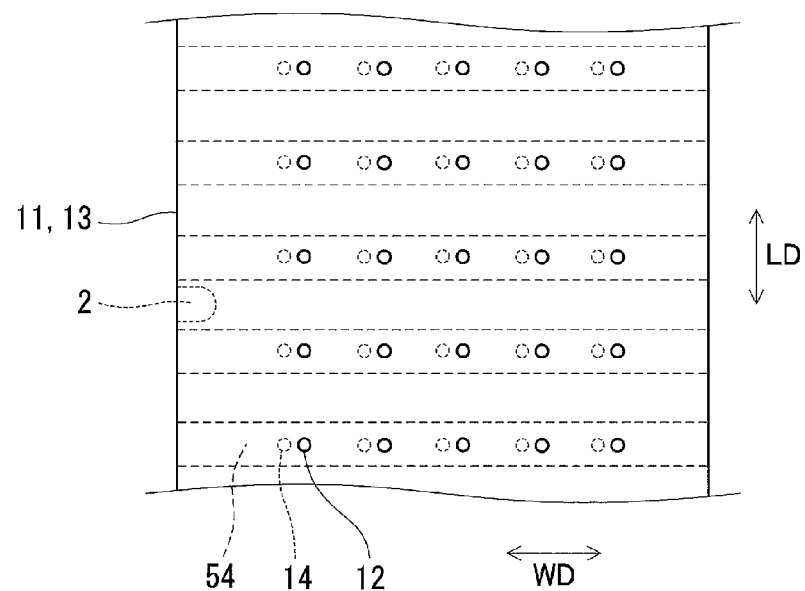
FIG. 12B is a partial development view of a first shell and a second shell according to the modification 5.

As shown in FIG. 12A and FIG. 12B, in a blowing roller 6F according to a modification 5, the second shell 13 has groove-shaped recesses 54 extending parallel to the width direction WD. The recesses 54 may be formed in the second shell 13 so as to extend from one end to the other end in the width direction WD. The plurality of recesses 54 are arranged in a row along the circumferential direction LD. The distance between adjacent recesses 54 is constant. A plurality of first through holes 12 face one recess 54. Similarly, a plurality of second through holes 14 open into one recess 54. With such a configuration, the same effect as that of the blowing roller 6E according to the modification 4 can be obtained.

(Modification 6)

Figure 13A:
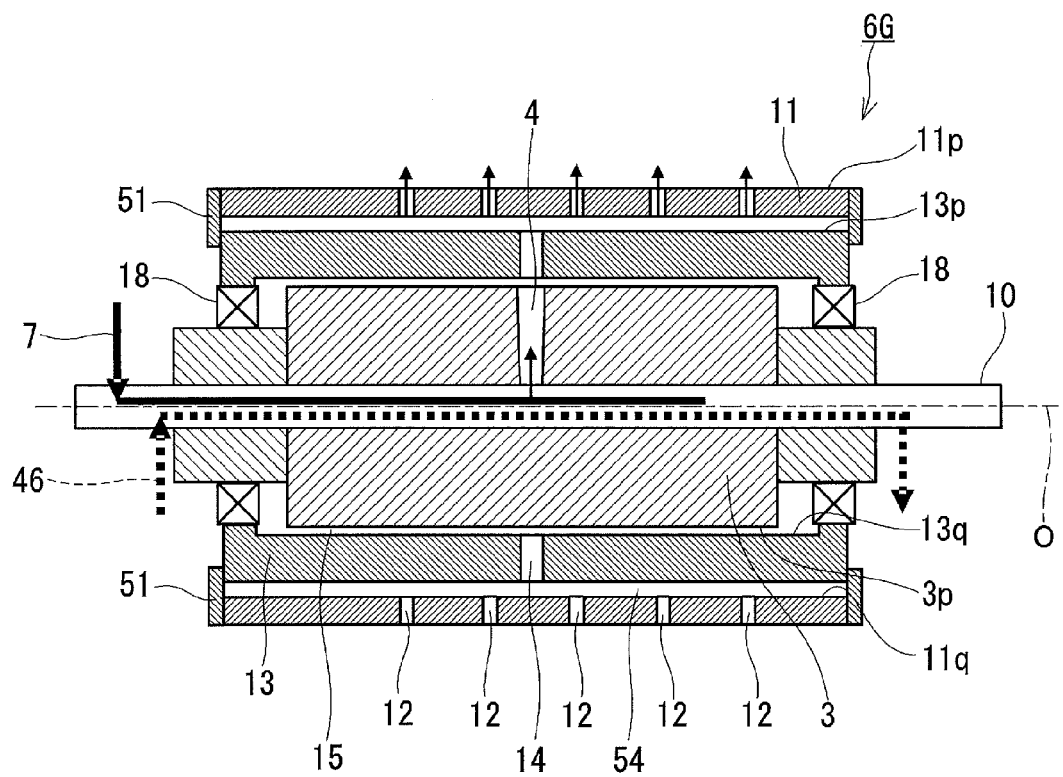
FIG. 13A is a longitudinal cross-sectional view of a blowing roller according to a modification 6.
Figure 13B:
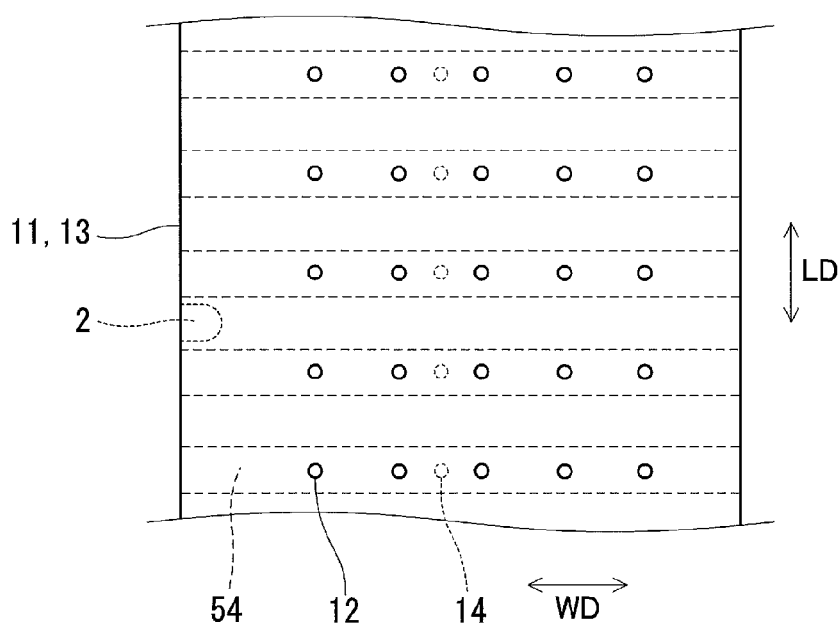
FIG. 13B is a partial development view of a first shell and a second shell according to the modification 6.

As shown in FIG. 13A and FIG. 13B, in a blowing roller 6G according to a modification 6, the second shell 13 has groove-shaped recesses 54 extending parallel to the width direction WD. The structure of the recesses 54 is the same as described with reference to FIG. 12A and FIG. 12B. In the second shell 13, a plurality of second through holes 14 are formed in only one row along the circumferential direction LD. In the internal block 3, only one manifold 4 is formed. A plurality of first through holes 12 face one recess 54. On the other hand, one second through hole 14 opens into one recess 54. With such a configuration, the cost of fabricating the blowing roller 6G can be further reduced.

(Modification 7)

Figure 14A:
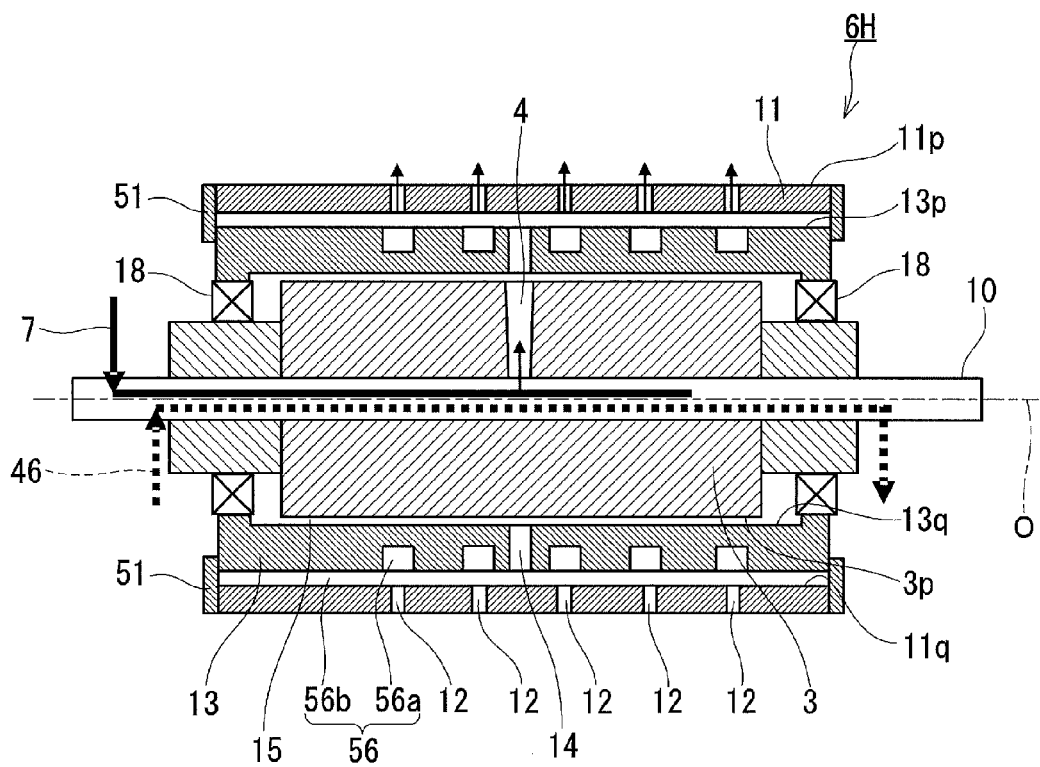
FIG. 14A is a longitudinal cross-sectional view of a blowing roller according to a modification 7.
Figure 14B:
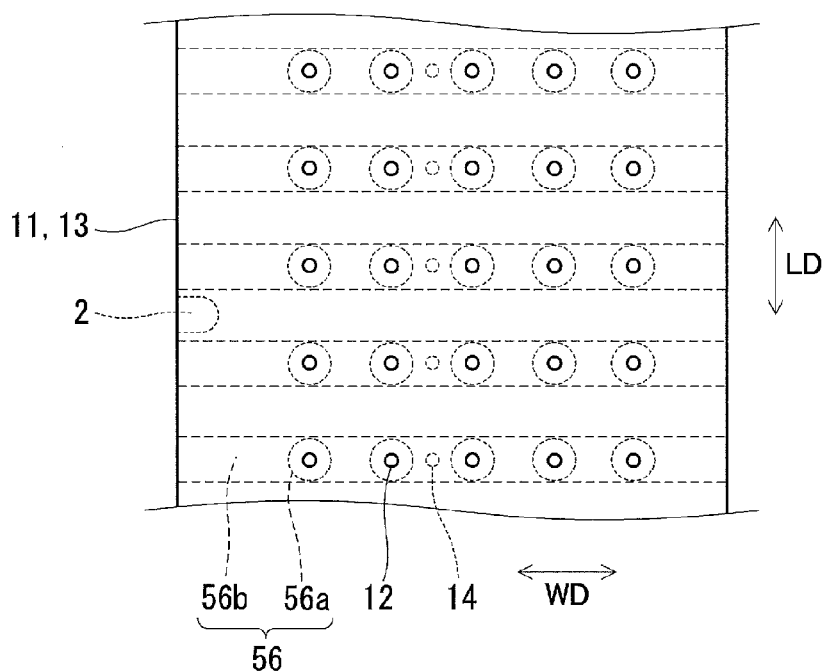
FIG. 14B is a partial development view of a first shell and a second shell according to the modification 7.

As shown in FIG. 14A and FIG. 14B, in a blowing roller 6H according to a modification 7, the second shell 13 has groove-shaped recesses 56 extending parallel to the width direction WD. The recesses 56 may be formed in the second shell 13 so as to extend from one end to the other end in the width direction WD. The plurality of recesses 56 are arranged in a row along the circumferential direction LD. The distance between adjacent recesses 56 is constant. In the second shell 13, a plurality of second through holes 14 are formed in only one row along the circumferential direction LD. In the internal block 3, only one manifold 4 is formed. A plurality of first through holes 12 face one recess 56. On the other hand, one second through hole 14 opens into one recess 56.

Specifically, the recess 56 includes a first portion 56a located on an extended line of the central axis of the first through holes 12, and a second portion 56b into which the second through hole 14 opens. The first portion 56a is deeper than the second portion 56b. With such a configuration, foreign matters are likely to be caught by the first portion 56a. Therefore, even when foreign matters can pass through the first through holes 12, the foreign matters are less likely to reach the second through holes 14.

(Modification 8)

Figure 15A:
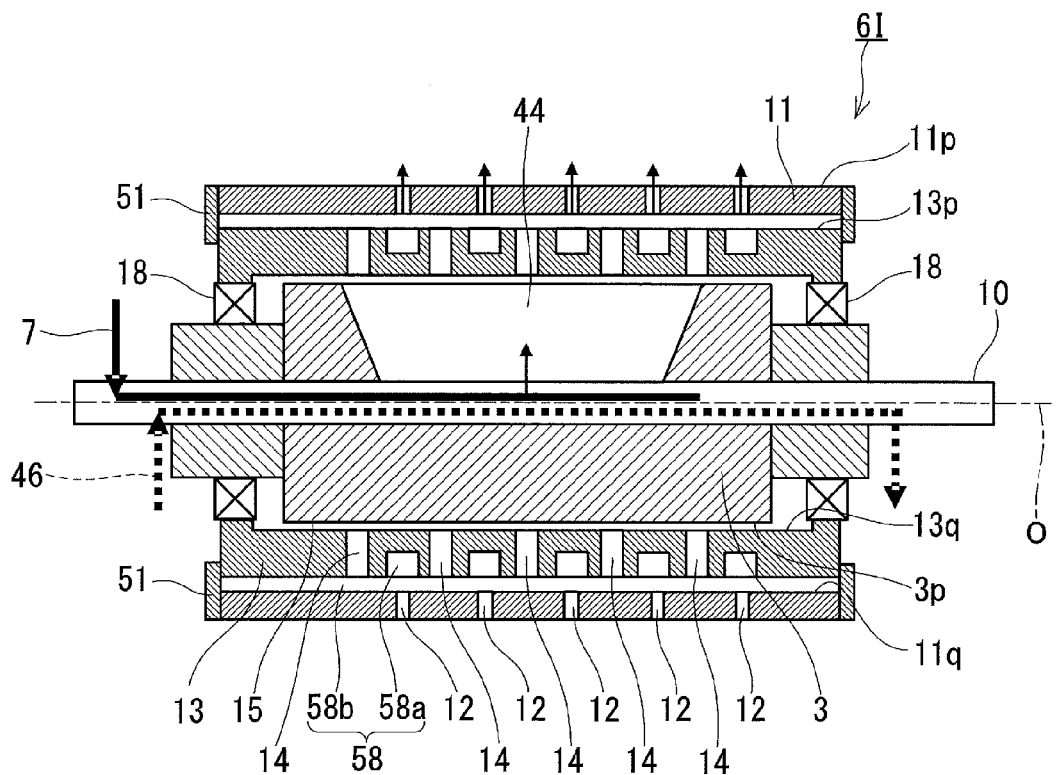
FIG. 15A is a longitudinal cross-sectional view of a blowing roller according to a modification 8.
Figure 15B:
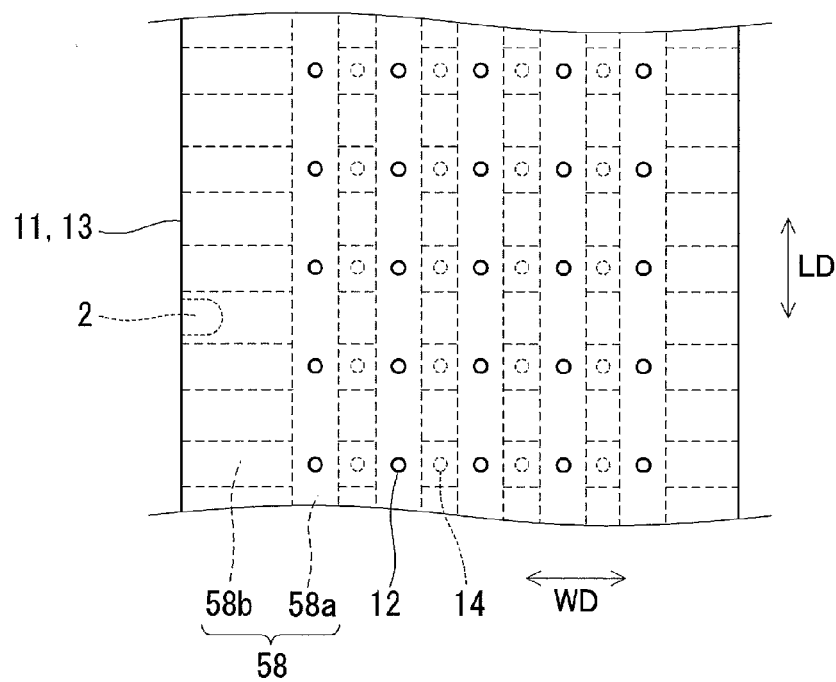
FIG. 15B is a partial development view of a first shell and a second shell according to the modification 8.
Figure 15C:
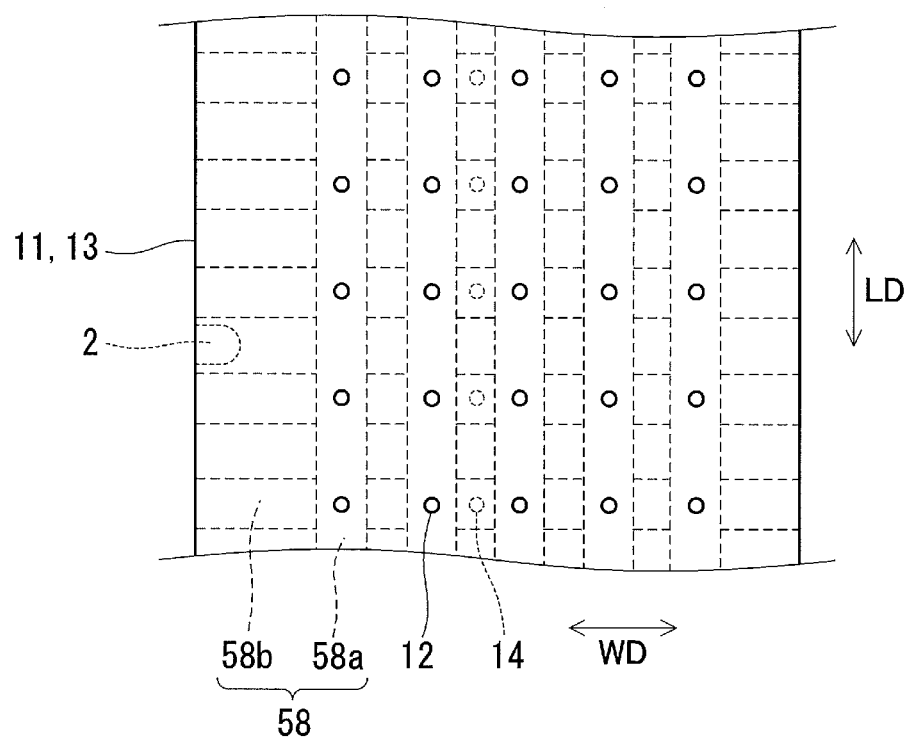
FIG. 15C is another partial development view of the first shell and the second shell according to the modification 8.

As shown in FIG. 15A and FIG. 15B, in a blowing roller 6I according to a modification 8, the second shell 13 has groove-shaped recesses 58 extending parallel to the width direction WD and the circumferential direction LD. Specifically, the recess 58 includes first portions 58a extending parallel to the circumferential direction LD, and second portions 58b extending parallel to the width direction WD. The first portion 58a is deeper than the second portions 58b. With such a configuration, foreign matters are likely to be caught by the first portion 58a. Therefore, even when foreign matters can pass through the first through holes 12, the foreign matters are less likely to reach the second through holes 14. In the internal block 3, a manifold 44 of large width is formed. The manifold 44 is the same as described with reference to FIG. 8. As shown in FIG. 15B and FIG. 15C, a plurality of first through holes 12 face one first portion 58a. A plurality of first through holes 12 face one second portion 58b. As shown in FIG. 15B, a plurality of second through holes 14 may open into one second portion 58b. As shown in FIG. 15C, one second through hole 14 may open into one second portion 58b.

As can be understood from the modifications described above, the shape of the recesses and the number of the second through holes 14 in the second shell 13 are not particularly limited. The shape and number of the manifolds 4 can be determined depending on the number of the second through holes 14. The advantageous configurations of the blowing rollers 6, 6B, 6C, 6D, 6E, 6F, 6G, 6H, and 6I described in the present specification can be combined with each other.

(Condition 1 for Carrying Out the Invention)

For example, in the blowing roller 6 shown in FIG. 3A, the outer diameter of the first shell 11 is set to 110 mm, the width of the first shell 11 is set to 120 mm, the thickness of the first shell 11 is set to 6.5 mm (the inner diameter of the first shell is set to 97H7), the diameter of the first through holes 12 is set to 1 mm, the pitch A is set to 20 degrees, the pitch B is set to 19 mm, and the first through holes 12 are arranged in five rows. The outer diameter of the second shell 13 is set to 97h7, the thickness of the second shell 13 is set to 6 mm, the diameter of the second through holes 14 is set to 0.7 mm, the pitch C is set to 20 degrees, the pitch D is set to 19 mm, and the second through holes 14 are arranged in five rows. The depth, width, and length of the recesses 50 are set to 2 mm, 3 mm, and 13 mm, respectively. On extended lines of the central axes of the first through holes 12, the diameter and depth of the recesses 50 are set to 3 mm and 4 mm. The central axes of the first through holes 12 and the central axes of the second through holes 14 are shifted from each other by 11.8 degrees. The distance between the second shell 13 and the internal block 3 in the clearance 15 is set to 100 µm. The manifold 4 in the internal block 3 is divided into five parts. Helium gas is introduced from the gas flow path 7 into two manifolds 4 located at both ends at a total flow rate of 20 sccm (Standard Cubic Centimeter per Minute), and into the other three manifolds 4 located in the central region at a total flow rate of 53 sccm. In this case, it is possible to obtain the same level of gas cooling performance as in the case where helium gas is introduced without gas introduction from the gas flow path 7 in such a manner that the pressure in the entire vacuum chamber 22 reaches 100 Pa. The heat transfer coefficient can be calculated as follows: the temperature of the substrate 21 travelling on the surface of the blowing roller 6 is measured with a thermocouple or the like; and the heat transfer coefficient is calculated from the travel time and the change in the temperature of the substrate 21. Although depending on the type of the substrate 21, the heat transfer coefficient in the gas cooling is, for example, 0.003 W/cm$^2$/K.

In the above case, if a structure for generating a differential pressure were simply provided in a part of the vacuum chamber 22, helium gas would need to be introduced at about 680 sccm. The blowing roller 6 can reduce the amount of the gas introduced to about ⅛. A relatively small amount of the gas is fed to the edge region of the substrate 21, while a relatively large amount of the gas is fed to the central region of the substrate 21. This can increase the intensity of cooling of the central region of the substrate 21, and thus can prevent deformation of the substrate 21.

(Condition 2 for Carrying Out the Invention)

A negative electrode for a lithium-ion secondary battery can be produced based on the following conditions by using the apparatus 20B for producing thin films which is shown in FIG. 2.

A surface-roughened copper foil (thickness: 18 µm, width: 100 mm) serving as a current collector is used as the substrate 21, and multi-layer silicon thin films having a thickness of 8 µm are formed on both surfaces of the current collector by vacuum evaporation. The vacuum chamber 22, which has a volume of 0.4 m$^3$ and which is equipped with two oil diffusion pumps serving as the evacuation pumps 35 and having a bore of 14 inches, is evacuated so that the pressure is decreased to 0.002 Pa, and then silicon serving as a film formation material is melted. The melting of the silicon is performed using a 270° deflection-type electron beam evaporation source (film formation source 19). The molten silicon is irradiated with an electron beam emitted at an acceleration voltage of −10 kV and an emission current of 520 to 700 mA, and the resultant vapor is directed to the substrate 21 travelling along the can 27.

A metal mask (length of each opening: 100 mm) which is not shown is placed about 2 mm away from the substrate 21 in such a manner that the width of a silicon thin film to be formed is 85 mm. The conveyance system 36B is configured to allow the substrate 21 to travel back and forth. One silicon thin film layer having a thickness of about 0.5 µm is formed on both surfaces of the substrate 21 every time travel in one direction is made. The film formation is repeated 16 times by causing the substrate 21 to travel back and forth. Thus, silicon thin films having a thickness of about 8 µm can be formed.

For example, the formation of each layer on both surfaces of the substrate 21 is performed at an average emission current of 600 mA, a substrate conveyance speed of 2 m/minute, and an average film formation rate of 80 nm/second.

The blowing roller 6 is disposed on the conveyance route between a position at which a silicon thin film is formed on one surface (first surface) of the substrate 21 and a position at which a film is formed on the other surface (second surface). In the blowing roller 6, the outer diameter of the first shell 11 is set to 120 mm, the width of the first shell 11 is set to 120 mm, the thickness of the first shell 11 is set to 4 mm, the diameter of the first through holes 12 is set to 1 mm, the pitch A is set to 20 degrees, the pitch B is set to 15 mm, and the first through holes 12 are arranged in five rows. The outer diameter of the second shell 13 is set to 112h7, the thickness of the second shell 13 is set to 6 mm, the diameter of the second through holes 14 is set to 0.7 mm, the pitch C is set to 20 degrees, the pitch D is set to 15 mm, and the second through holes 14 are arranged in five rows. The depth, width, and length of the recesses 50 are set to 2 mm, 3 mm, and 14.6 mm, respectively. On extended lines of the central axes of the first through holes 12, the diameter and depth of the recesses 50 are set to 3 mm and 4 mm. The central axes of the first through holes 12 and the central axes of the second through holes 14 are shifted from each other by 11.8 degrees. The distance between the second shell 13 and the internal block 3 in the clearance 15 is set to 80 µm. Helium gas is introduced from the gas flow path 7 into the manifolds 4 at a total flow rate of 80 sccm.

In the above case, the temperature of the substrate 21 at the start of film formation on one surface of the substrate 21 and the temperature of the substrate 21 at the start of film formation on the other surface can be made almost equal. Since the temperatures of the substrate 21 at the start of film formation on one surface and at the start of film formation on the other surface are made uniform, the qualities of thin films can be equalized. In addition, warpage of the substrate 21 having undergone film formation, which may result from the difference in thermal expansion coefficient, can be reduced. In addition, by lowering the temperature of the substrate 21 at the start of film formation on the second surface, the highest temperature that the substrate 21 reaches can be reduced, and the deterioration of the substrate 21 can be prevented. By way of example, when a silicon thin film is formed on a copper foil substrate to produce an electrode plate for a battery, the degradation of the copper foil due to temperature increase can be evaluated based on, for example, the change in values of mechanical properties measured by a tensile test or the like. A thermally-degraded copper foil exhibits characteristics such as increase in the degree of stretching by a tensile load, and reduction in tensile strength at break. Since the silicon thin film used in a lithium secondary battery electrode plate is expanded at the time of lithium absorption, such deterioration in properties leads to deformation and breaking of the electrode plate.

In addition, the blowing roller 6 is disposed also on the route between the film formation position and the spool roller 26. Thus, the temperature of the substrate 21 at the time of winding can be adjusted to around ordinary temperature. Since the temperature of the substrate 21 at the time of winding is adjusted to around ordinary temperature, occurrence of wrinkles due to thermal deformation of the substrate 21 being wound can be prevented, and tight winding due to contraction of the substrate 21 having been wound can be prevented.

In the blowing roller 6, the outer diameter of the first shell 11 is set to 80 mm, the width of the first shell 11 is set to 120 mm, the thickness of the first shell 11 is set to 4 mm (the inner diameter of the first shell is set to 72H7), the diameter of the first through holes 12 is set to 1 mm, the pitch A is set to 15 degrees, the pitch B is set to 15 mm, and the first through holes 12 are arranged in five rows. The outer diameter of the second shell 13 is set to 72h7, the thickness of the second shell 13 is set to 6 mm, the diameter of the second through holes 14 is set to 0.7 mm, and the pitch C is set to 15 degrees, the pitch D is set to 15 mm, and the second through holes 14 are arranged in five rows. The depth, width, and length of the recesses 50 are set to 2 mm, 3 mm, and 7.4 mm, respectively. On extended lines of the central axes of the first through holes 12, the diameter and depth of the recesses 50 are set to 3 mm and 4 mm. The central axes of the first through holes 12 and the central axes of the second through holes 14 are shifted from each other by 11.8 degrees. The distance between the second shell 13 and the internal block 3 in the clearance 15 is set to 50 μm. The manifold 4 in the internal block 3 is divided into five parts. Argon gas is introduced from the gas flow path 7 into two manifolds 4 located at both ends at a total flow rate of 14 sccm, and into the other three manifolds 4 located in the central region at a total flow rate of 36 sccm.

As described above, the technique disclosed in the present specification allows efficient use of a gas, and thus can prevent the degree of vacuum from deteriorating during cooling. The technique disclosed in the present specification can prevent locking of the substrate-conveying rollers, and thus can prevent damage to a substrate. In addition, since the technique disclosed in the present specification can be used in combination with another gas cooling method, increase in the size of equipment such as evacuation pumps can be prevented, and a low-cost apparatus for producing thin films can be constructed.

INDUSTRIAL APPLICABILITY

The technique disclosed in the present specification can be suitably used for an apparatus for producing thin films which is required to allow high-speed stable film formation. Specifically, the technique disclosed in the present specification can be used for production of devices and functional thin films. Examples of the devices include electrode plates for lithium-ion secondary batteries, electrode plates for electrochemical capacitors, capacitors, solar cells, and various types of sensors. Examples of the functional thin films include transparent electrode films, decorative films, magnetic tapes, gas barrier membranes, various types of optical membranes, and hard protective membranes.

The invention claimed is:

1. A substrate-conveying roller having a function of conveying a substrate under vacuum, and a function of supplying a gas for cooling the substrate to the substrate under vacuum, the substrate-conveying roller comprising:

a first shell having a cylindrical outer circumferential surface for supporting the substrate, and a plurality of first through holes provided along a circumferential direction of the outer circumferential surface and serving as supply paths for the gas, the first shell being capable of rotating in synchronization with the substrate;

an internal block disposed inside the first shell and blocked from rotating in synchronization with the substrate;

a manifold that is a space defined by the internal block inside the first shell so as to retain the gas introduced from outside, that is formed so as to guide the gas to the plurality of first through holes within the range of a specific angle whose vertex is on a rotational axis of the first shell, and that has a relatively large size in a radial direction of the first shell;

a clearance that is a space formed inside the first shell, that is formed so as to guide the gas to the plurality of first through holes outside the range of the specific angle, and that has a relatively small size in the radial direction; and a second shell disposed between the first shell and the internal block, and having a second through hole for guiding the gas from the manifold to the plurality of first through holes, wherein a central axis of the first through hole is offset from a central axis of the second through hole.

2. The substrate-conveying roller according to claim 1, wherein the first shell rotates in synchronization with the second shell.

3. The substrate-conveying roller according to claim 2, wherein the second shell has an outer circumferential surface that is in close contact with an inner circumferential surface of the first shell, and the clearance is formed between the second shell and the internal block.

4. The substrate-conveying roller according to claim 1, wherein an outline of the first through hole is spaced apart from an outline of the second through hole, when viewed in a projection view obtained by developing the first shell and the second shell, and projecting the first shell and the second shell on a plane parallel to a surface of the first shell.

5. The substrate-conveying roller according to claim 1, wherein the second shell further has a recess formed at such a position that the recess faces the first through hole, and the second through hole opens into the recess.

6. The substrate-conveying roller according to claim 5, wherein the plurality of first through holes face the recess.

7. The substrate-conveying roller according to claim 5, wherein the second shell has a plurality of the second through holes, and the plurality of second through holes open into the recess.

8. The substrate-conveying roller according to claim 1, further comprising a support body supporting the internal block, wherein the support body has a gas flow path for introducing the gas from outside into the manifold.

9. The substrate-conveying roller according to claim 1, wherein the first through hole has a diameter decreasing from an outer circumference side of the first shell toward a center side of the first shell.

10. The substrate-conveying roller according to claim 1, wherein the second through hole has a diameter decreasing from an outer circumference side of the second shell toward a center side of the second shell.

11. The substrate-conveying roller according to claim 5, wherein
the recess includes a first portion located on an extended line of the central axis of the first through hole and a second portion into which the second through hole opens, and
the first portion is deeper than the second portion.

12. The substrate-conveying roller according to claim 1, wherein a portion of the second through hole that is located on an outer circumference side of the second shell has a smaller diameter than a portion of the first through hole that is located on a center side of the first shell.

13. The substrate-conveying roller according to claim 1, wherein
the plurality of first through holes constitute: (i) a first group provided along the circumferential direction at a predetermined position in a width direction parallel to the rotational axis; and (ii) a second group provided along the circumferential direction at a position adjacent to the predetermined position, and
the first through holes belonging to the first group and the first through holes belonging to the second group are arranged in a staggered manner.

14. An apparatus for producing thin films, comprising:
a vacuum chamber;
a conveyance system having the substrate-conveying roller according to claim 1 and disposed in the vacuum chamber so as to convey an elongated substrate from an unwinding position to a winding position;
an opening provided in a conveyance route of the conveyance system; and
a film formation source for applying a material to the substrate at the opening.

15. A method for producing thin films, comprising steps of:
constructing a conveyance system for an elongated substrate in a vacuum chamber using the substrate-conveying roller according to claim 1;
conveying the elongated substrate from an unwinding position to a winding position in the conveyance system; and
evaporating a material from a film formation source toward an opening provided in a conveyance route of the conveyance system, so as to apply the material to the substrate.

* * * * *